United States Patent
Fukuda

(10) Patent No.: US 10,813,206 B2
(45) Date of Patent: Oct. 20, 2020

(54) EXTREME ULTRAVIOLET LIGHT GENERATION APPARATUS

(71) Applicant: Gigaphoton Inc., Tochigi (JP)

(72) Inventor: Osamu Fukuda, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/673,667

(22) Filed: Nov. 4, 2019

(65) Prior Publication Data

US 2020/0068697 A1 Feb. 27, 2020

Related U.S. Application Data

(63) Continuation of application No. PCT/JP2017/021759, filed on Jun. 13, 2017.

(51) Int. Cl.
*H05G 2/00* (2006.01)
*G21K 1/06* (2006.01)

(52) U.S. Cl.
CPC .............. *H05G 2/008* (2013.01); *G21K 1/06* (2013.01); *H05G 2/005* (2013.01)

(58) Field of Classification Search
CPC ........ H05G 2/001; H05G 2/003; H05G 2/005; H05G 2/006; H05G 2/008; G21K 1/06; G03F 7/70033; G02B 7/182
See application file for complete search history.

(56) References Cited

U.S. PATENT DOCUMENTS

| | | | | |
|---|---|---|---|---|
| 2005/0057827 A1* | 3/2005 | Miyachi | ................. | G02B 7/182 359/849 |
| 2008/0104828 A1* | 5/2008 | Someya | ................. | H05G 2/001 29/720 |
| 2009/0301517 A1* | 12/2009 | Asayama | ................. | B08B 7/00 134/1.1 |

(Continued)

FOREIGN PATENT DOCUMENTS

| | | |
|---|---|---|
| JP | 2004-063934 A | 2/2004 |
| JP | 2004-128105 A | 4/2004 |

(Continued)

OTHER PUBLICATIONS

International Search Report issued in PCT/JP2017/021759; dated Sep. 12, 2017.

(Continued)

*Primary Examiner* — David E Smith
(74) *Attorney, Agent, or Firm* — Studebaker & Brackett PC

(57) ABSTRACT

An extreme ultraviolet light generation apparatus includes: A. a chamber in which extreme ultraviolet light is generated by a target substance being irradiated with a laser beam to generate plasma from the target substance; B. a vessel as a tubular member forming the chamber; C. a reference member supporting the vessel; D. a collector mirror configured to condense the extreme ultraviolet light in the chamber, the collector mirror being attached to the reference member in a replaceable manner and covered by the vessel to be housed (Continued)

in the chamber; and E. a vessel movement mechanism provided to the reference member and configured to move the vessel between a first position at which the vessel covers the collector mirror and a second position at which the vessel is retracted from the first position to expose the collector mirror.

19 Claims, 25 Drawing Sheets

(56) References Cited

U.S. PATENT DOCUMENTS

| | | | |
|---|---|---|---|
| 2010/0193711 A1 | 8/2010 | Watanabe et al. | |
| 2013/0105713 A1* | 5/2013 | Watanabe | H05G 2/008 |
| | | | 250/504 R |
| 2014/0332700 A1* | 11/2014 | Igarashi | H05G 2/003 |
| | | | 250/504 R |
| 2018/0034228 A1 | 2/2018 | Funaoka et al. | |

FOREIGN PATENT DOCUMENTS

| | | |
|---|---|---|
| JP | 2005/0057827 A1 | 4/2004 |
| JP | 2008-108599 A | 5/2008 |
| JP | 2008-118020 A | 5/2008 |
| JP | 2010/0193711 A1 | 2/2011 |
| JP | 4943121 B2 | 5/2012 |
| JP | 2013-069655 A | 4/2013 |
| JP | 2013-175431 A | 9/2013 |
| WO | 2016171158 A1 | 10/2016 |

OTHER PUBLICATIONS

International Preliminary Report on Patentability and Written Opinion issued in PCT/JP2017/021759; dated Dec. 17, 2019.

* cited by examiner

US 10,813,206 B2

EXTREME ULTRAVIOLET LIGHT GENERATION APPARATUS

CROSS-REFERENCE TO RELATED APPLICATIONS

The present application is a continuation application of International Application No. PCT/JP2017/021759 filed on Jun. 13, 2017. The content of the application is incorporated herein by reference in its entirety.

BACKGROUND

1. Technical Field

The present disclosure relates to an extreme ultraviolet light generation apparatus.

2. Related Art

Recently, miniaturization of a transfer pattern in optical lithography of a semiconductor process has been rapidly proceeding along with miniaturization of the semiconductor process. Minute fabrication at 20 nm or smaller will be requested in the next generation technology. To meet the request for minute fabrication at 20 nm or smaller, for example, it is desired to develop an exposure device including an extreme ultraviolet light generation apparatus configured to generate extreme ultraviolet (EUV) light at a wavelength of 13 nm approximately in combination with reduced projection reflective optics.

Disclosed EUV light generation apparatuses include the three kinds of devices of a laser produced plasma (LPP) device that uses plasma generated by irradiating a target material with a pulse laser beam, a discharge produced plasma (DPP) device that uses plasma generated by electrical discharge, and a synchrotron radiation (SR) device that uses synchrotron radiation.

LIST OF DOCUMENTS

Patent Documents

Patent Document 1: Japanese Unexamined Patent Application Publication No. 2004-128105
Patent Document 2: Japanese Unexamined Patent Application Publication No. 2004-063934
Patent Document 3: Japanese Patent No. 4943121
Patent Document 4: Japanese Unexamined Patent Application Publication No. 2008-108599

SUMMARY

An extreme ultraviolet light generation apparatus according to one aspect of the present disclosure includes:

A. a chamber in which extreme ultraviolet light is generated by a target substance being irradiated with a laser beam to generate plasma from the target substance;
B. a vessel as a tubular member forming the chamber;
C. a reference member supporting the vessel;
D. a collector mirror configured to condense the extreme ultraviolet light in the chamber, the collector mirror being attached to the reference member in a replaceable manner and covered by the vessel to be housed in the chamber; and
E. a vessel movement mechanism provided to the reference member and configured to move the vessel between a first position at which the vessel covers the collector mirror and a second position at which the vessel is retracted from the first position to expose the collector mirror.

BRIEF DESCRIPTION OF THE DRAWINGS

Embodiments of the present disclosure will be described below as examples with reference to the accompanying drawings.

DESCRIPTION OF EMBODIMENTS

<Contents>
1. Comparative Example
 1.1 Overall Description of Extreme Ultraviolet Light Generation System
  1.1.1 Configuration
  1.1.2 Operation
 1.2 Detailed Description of EUV Light Generation Apparatus
  1.2.1 Configuration
  1.2.2 Operation
 1.3 Description of Replacement Procedure of EUV Light Condenser Mirror
 1.4 Problem
2. First Embodiment
 2.1 Description of EUV Light Generation Apparatus of First Embodiment
  2.1.1 Configuration of Vessel Movement Mechanism
  2.1.2 Configuration of Positioning Mechanism
  2.1.3 Ring Groove of O Ring
 2.2 Description of Replacement Procedure of EUV Light Condenser Mirror
 2.3 Effect
  2.3.1 Effect of Vessel Movement Mechanism
  2.3.2 Effect of Air Cylinder
  2.3.3 Effect of Ring Groove
  2.3.4 Effect of Positioning Mechanism
 2.4 Other
3. Second Embodiment
 3.1 Description of EUV Light Generation Apparatus of Second Embodiment
 3.2 Effect
4. Third Embodiment
 4.1 Description of EUV Light Generation Apparatus of Third Embodiment
 4.2 Effect
5. Fourth Embodiment
 5.1 Description of EUV Light Generation Apparatus of Fourth Embodiment
 5.2 Effect
6. Fifth Embodiment
7. Sixth Embodiment
8. Seventh Embodiment Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

Figure 1:
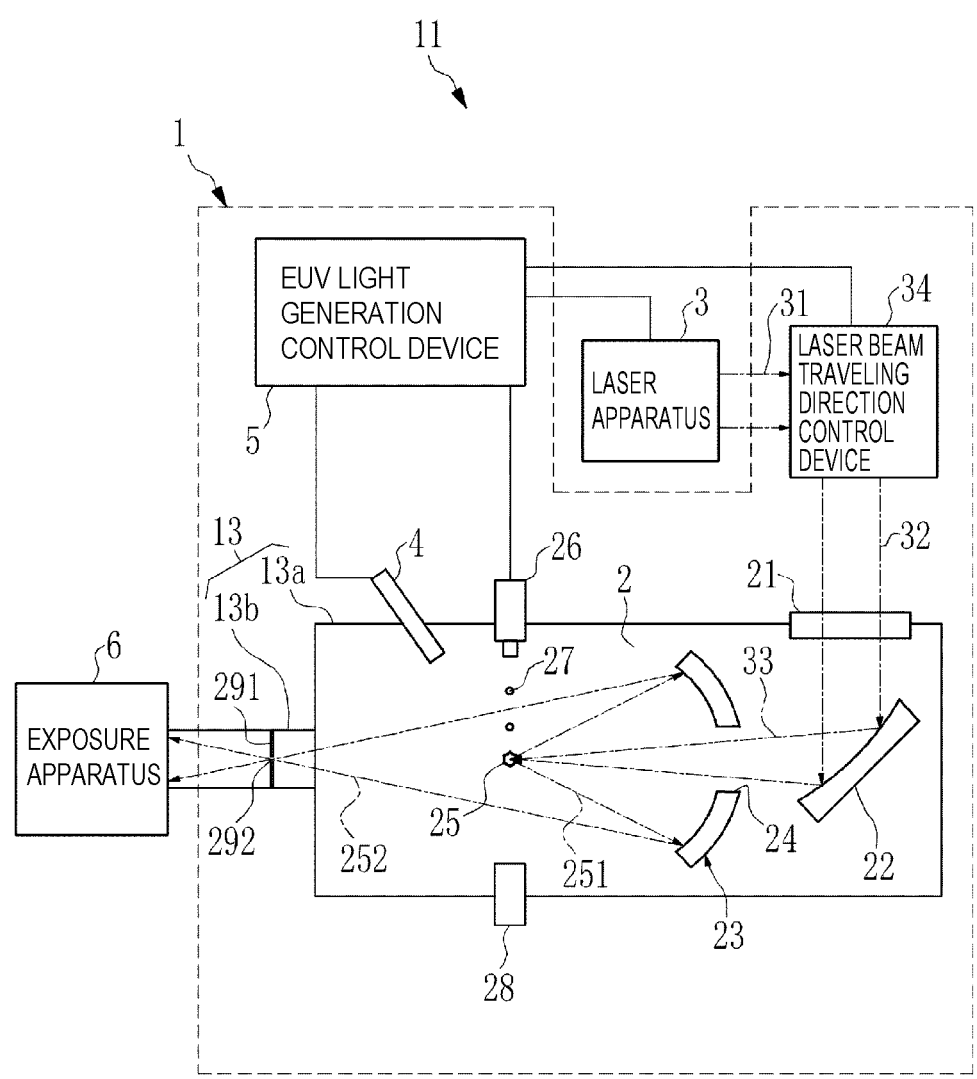
FIG. 1 schematically illustrates the configuration of an exemplary LPP EUV light generation system.

1. Comparative Example 1.1 Overall Description of Extreme Ultraviolet Light Generation System 1.1.1 Configuration FIG. 1 schematically illustrates the entire configuration of an extreme ultraviolet light generation system 11. Hereinafter, extreme ultraviolet light is referred to as EUV (extreme ultraviolet) light, and the extreme ultraviolet light generation system 11 is referred to as an EUV light generation system. The EUV light generation system 11 includes an EUV light generation apparatus 1 as an extreme ultraviolet light generation apparatus, and a laser apparatus 3. The EUV light generation system 11 is used as a light source of an exposure apparatus 6. EUV light generated by the EUV light generation system 11 is input to the exposure apparatus 6.

The EUV light generation apparatus 1 employs a laser-produced plasma (LPP) scheme of generating EUV light by irradiating a target substance with a laser beam to excite the target substance. The EUV light generation apparatus 1 includes a vessel 13 forming a chamber 2, a target supply device 26, and a laser beam traveling direction control device 34.

The vessel 13 is a tubular member forming the chamber 2, and the chamber 2 as an internal space is sealable. The target supply device 26 is attached to the vessel 13, for example, through a wall of the chamber 2. The target supply device 26 uses, for example, melted tin (Sn) as the target substance. The material of the target substance is not limited to tin, but may contain terbium, gadolinium, lithium, xenon, or a combination of two or more of these materials. The target supply device 26 is disposed to supply a target 27 as the target substance toward a plasma generation region 25 in the chamber 2.

The laser beam traveling direction control device 34 includes an optical system for defining the traveling direction of a laser beam 31 output from the laser apparatus 3, and an actuator for adjusting the disposition, posture, and the like of the optical system. The laser beam traveling direction control device 34 outputs the laser beam 31, the traveling direction of which is controlled, to the chamber 2 as a laser beam 32.

The vessel 13 is provided with a plurality of through-holes communicated with the chamber 2 to attach various components to an outer peripheral surface of the vessel 13. One of the through-holes is provided with a window 21 through which the laser beam 32 transmits. The chamber 2 includes a laser beam condenser mirror 22 and an EUV light condenser mirror 23. The laser beam condenser mirror 22 reflects, toward the EUV light condenser mirror 23, the laser beam 32 incident in the chamber 2 through the window 21. The laser beam 32 reflected by the laser beam condenser mirror 22 travels toward the EUV light condenser mirror 23 as a laser beam 33.

The EUV light condenser mirror 23 includes, for example, a spheroidal reflection surface. The EUV light condenser mirror 23 has first and second focal points. For example, a multi-layer reflective film in which molybdenum and silicon are alternately stacked is formed on the surface of the EUV light condenser mirror 23. The EUV light condenser mirror 23 is disposed so that, for example, the first focal point is positioned in the plasma generation region 25 and the second focal point is positioned at an intermediate focus point (IF) 292. In addition, a through-hole 24 through which the laser beam 33 reflected by the laser beam condenser mirror 22 passes is provided at a central part of the EUV light condenser mirror 23. The EUV light condenser mirror 23 corresponds to a collector mirror.

The EUV light generation apparatus 1 further includes an EUV light generation control device 5 and a target sensor 4. The target sensor 4 has an image capturing function and detects the existence, trajectory, position, speed, and the like of the target 27. The vessel 13 further includes a target collection unit 28. The target collection unit 28 collects the target 27 output from the target supply device 26.

The EUV light generation control device 5 collectively controls the entire EUV light generation system 11. The EUV light generation control device 5 processes, for example, image data of the target 27 captured by the target sensor 4. The EUV light generation control device 5 controls the output timing of the target 27, the output direction of the target 27, and the like. In addition, the EUV light generation control device 5 controls the oscillation timing of the laser apparatus 3, the traveling direction of the laser beam 32, the condensation position of the laser beam 33, and the like. These various kinds of control are merely exemplary, and may include other control as necessary in the EUV light generation control device 5.

The vessel 13 includes a body part 13a that forms the chamber 2, and a connection unit 13b. The connection unit 13b provides communication between the inside of the chamber 2 and the inside of the exposure apparatus 6. The connection unit 13b includes a wall 291 through which an aperture is formed. The wall 291 is disposed so that the aperture is positioned at the intermediate focus point 292 corresponding to the second focal point of the EUV light condenser mirror 23.

1.1.2 Operation

The following describes the operation of the EUV light generation apparatus 1 with reference to FIG. 1. The laser beam 31 output from the laser apparatus 3 passes through the laser beam traveling direction control device 34, and is incident in the chamber 2 through the window 21 as the laser beam 32. The laser beam 32 travels in the chamber 2 along at least one laser beam path, and is reflected by the laser beam condenser mirror 22 and incident on the at least one target 27 as the laser beam 33.

The target supply device 26 outputs the target 27 toward the plasma generation region 25 in the chamber 2. The target 27 is irradiated with at least one pulse included in the laser beam 33. Plasma is generated from the target 27 irradiated with the laser beam 33, and radiates radiation light 251. EUV light 252 included in the radiation light 251 is selectively reflected by the EUV light condenser mirror 23. The EUV light 252 reflected by the EUV light condenser mirror 23 is output to the exposure apparatus 6 through the intermediate focus point 292.

1.2 Detailed description of EUV light generation apparatus 1.2.1 Configuration

Figure 2:
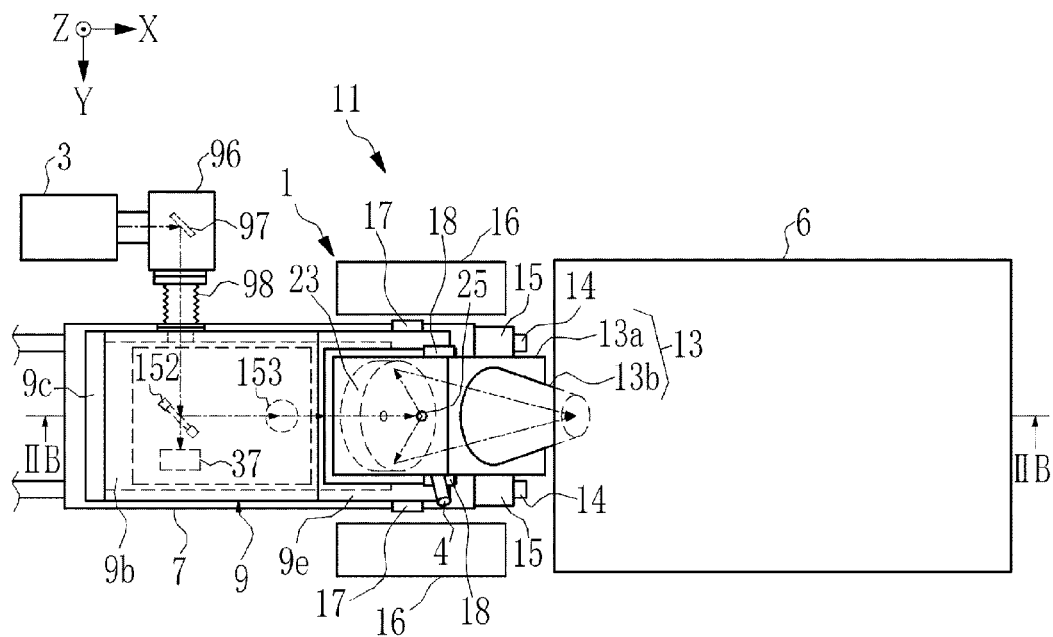
FIG. 2 is a plan view illustrating a state in which an EUV light generation apparatus is connected with an exposure apparatus.
Figure 3:
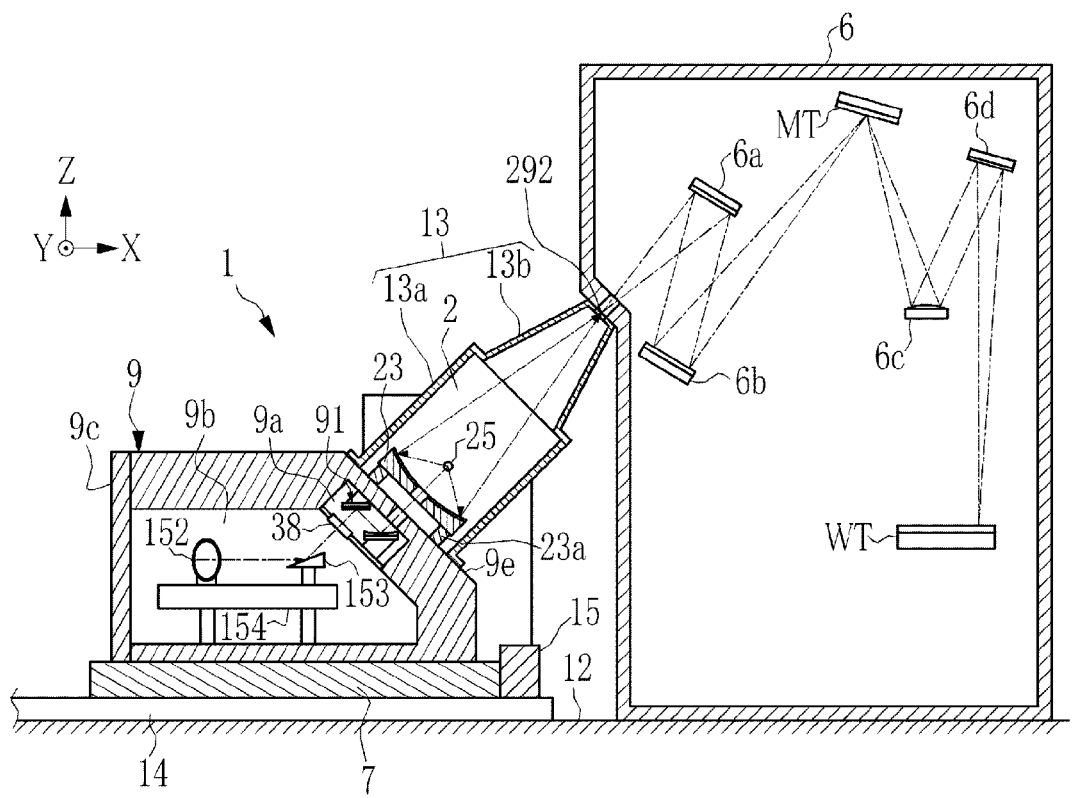
FIG. 3 is a cross-sectional view of the EUV light generation apparatus and the exposure apparatus taken along line IIB-IIB in FIG. 2.

FIG. 2 is a plan view illustrating a state in which the EUV light generation apparatus 1 is connected with the exposure apparatus 6. FIG. 3 is a cross-sectional view of the EUV light generation apparatus 1 and the exposure apparatus 6 taken along line IIB-IIB in FIG. 2.

As illustrated in FIGS. 2 and 3, the EUV light generation apparatus 1 includes an installation mechanism 7 and a chamber reference member 9 in addition to the vessel 13. The outer shape of the body part 13a of the vessel 13 is, for example, a rectangular tubular shape having a rectangular sectional shape. As illustrated in FIGS. 1 and 3, the axial direction of the vessel 13 is a direction along a virtual axis connecting the plasma generation region 25 with the intermediate focus point 292 in the chamber 2. Thus, the axial direction of the vessel 13 is the output axial direction of the EUV light 252 in the chamber 2. The chamber 2 as an internal space of the body part 13a is a space having a circular section orthogonal to the axial direction of the vessel 13. The outer shape and the shape of the internal space of the connection unit 13b are substantially circular truncated cone shapes.

The connection unit 13b has a base end side connected with the body part 13a, and has a diameter that decreases from the base end side toward a leading end side connected with the exposure apparatus 6. As illustrated in FIG. 1, the chamber 2 as the internal space of the vessel 13 is communicated with the internal space of the connection unit 13b.

For example, the EUV light generation apparatus 1 and the exposure apparatus 6 are installed on a floor surface 12 illustrated in FIG. 3. The installation mechanism 7 supports the chamber reference member 9. The chamber reference member 9 supports the vessel 13 forming the chamber 2. As described later, the chamber reference member 9 is a reference member as a reference of the positional relation among various kinds of optical systems provided to the EUV light generation apparatus 1. In the EUV light generation apparatus 1, an X axial direction is defined to be the front-back direction with the front side as a side facing the exposure apparatus 6 and with the back side as the opposite side. A Y axial direction is defined to be the width direction of the EUV light generation apparatus 1, and a Z axial direction is defined to be the height direction.

The installation mechanism 7 includes a wheel (not illustrated), and functions as a truck on which the chamber reference member 9 is mounted. A rail 14 on which the installation mechanism 7 travels is laid on the floor surface 12. The rail 14 extends in the X axial direction. The EUV light generation apparatus 1 moves in the front-back direction as the installation mechanism 7 travels on the rail 14. Accordingly, the chamber reference member 9 and the vessel 13 supported by the chamber reference member 9 are movable relative to the exposure apparatus 6. A stopper 15 that contacts the installation mechanism 7 is provided on the rail 14. The stopper 15 functions as a mechanism configured to determine the position of the chamber reference member 9 in the X axial direction. The chamber reference member 9 on the installation mechanism 7 is positioned relative to the exposure apparatus 6 by the stopper 15.

The chamber reference member 9 is provided with an attachment surface 9e to which the vessel 13 and the EUV light condenser mirror 23 are attached. The attachment surface 9e is tilted relative to the horizontal direction corresponding to an X-Y plane parallel to the floor surface 12. The vessel 13 is fixed to the chamber reference member 9 with one end of the body part 13a being attached to the attachment surface 9e. When the vessel 13 is attached to the attachment surface 9e, one end opening of the chamber 2, which is formed at the body part 13a, is blocked by the attachment surface 9e. The vessel 13 covers the EUV light condenser mirror 23 fixed to the attachment surface 9e when the vessel 13 is attached to the attachment surface 9e. Accordingly, the EUV light condenser mirror 23 is housed in the chamber 2.

The connection unit 13b of the vessel 13 is connected with the exposure apparatus 6. The vessel 13 is fixed to the chamber reference member 9 in a posture in which the axial direction of the vessel 13 is orthogonal to the attachment surface 9e. Since the attachment surface 9e is tilted relative to the horizontal direction, the vessel 13 is disposed while the axial direction thereof is tilted upward toward the exposure apparatus 6 relative to the horizontal direction. The tilt angle of the attachment surface 9e to which the vessel 13 is fixed is determined so that the angle of the axial direction of the vessel 13 is equal to a predetermined angle defined by, for example, specifications of a connection part with the exposure apparatus 6. The tilt angle of the attachment surface 9e is 45° approximately relative to the horizontal direction in the present example, but may be smaller or larger than 45°.

As illustrated in FIG. 1, for example, the target sensor 4, the target supply device 26, and the target collection unit 28 are attached to the vessel 13. These components partially protrude from the outer peripheral surface of the vessel 13, but in FIG. 2 and the following drawings, for the sake of simplicity to avoid drawing complication, only the target sensor 4 is illustrated and the target supply device 26 and the target collection unit 28 are not illustrated. A cooling water pipe and the like are connected with the vessel 13 in addition to these components, but they are also not illustrated.

The vessel 13 is attached to the chamber reference member 9 in a separable manner. As described later, the vessel 13 is separated from the chamber reference member 9 at maintenance such as replacement of a component of the EUV light condenser mirror 23 housed in the chamber 2. As illustrated in FIG. 2, in the width direction of the EUV light generation apparatus 1, convex portions 17 are provided on both side surfaces of the chamber reference member 9, and convex portions 18 are provided on both side surfaces of the vessel 13. As described later, the convex portions 17 and 18 each function as a hook part to which a crane used to separate the vessel 13 from the chamber reference member 9 is hooked.

As illustrated in FIG. 3, the EUV light condenser mirror 23 is attached to the chamber reference member 9 in a replaceable manner. The EUV light condenser mirror 23 is fixed to the chamber reference member 9 through, for example, an EUV light condenser mirror holder 23a. The EUV light condenser mirror holder 23a increases the accuracy of positioning of the position, posture, and the like of the EUV light condenser mirror 23 relative to the chamber reference member 9, and reduces variation in the position, posture, and the like of the EUV light condenser mirror 23. When the vessel 13 is connected with the exposure apparatus 6, the installation mechanism 7 is pressed against the stopper 15. Accordingly, the position of the chamber reference member 9 relative to the exposure apparatus 6 is accurately adjusted, and thus the position of the EUV light condenser mirror 23 relative to the exposure apparatus 6 is accurately adjusted as well. Hereinafter, the position at which the vessel 13 and the exposure apparatus 6 are connected with each other as illustrated in FIGS. 2 and 3 is referred to as a connection position.

For example, the chamber reference member 9 includes a housing chamber 9a communicated with the inside of the chamber 2 through a through-hole, and a housing chamber 9b adjacent to the housing chamber 9a. A window 38 is provided between the housing chamber 9a and the housing chamber 9b. Accordingly, the pressure in the chamber 2 is maintained low, and gas in the chamber 2 is sealed. The housing chamber 9b has an opening at the back side, and a lid 9c is attached to the opening. The inside of the housing chamber 9b is sealable by the lid 9c.

A laser beam condensation optical system 91 is disposed in the housing chamber 9a. A laser beam introduction optical system including a beam splitter 152 and a high reflectance mirror 153 is disposed in the housing chamber 9b. The beam splitter 152 and the high reflectance mirror 153 are fixed to an attachment mount 154. In addition, a laser beam meter 37 is disposed in the housing chamber 9b and fixed to the attachment mount 154 as illustrated in FIG. 2.

The laser beam condensation optical system 91 is positioned and fixed to the chamber reference member 9 by a holder. This increases the accuracy of positioning of the position, posture, and the like of the laser beam condensation optical system 91 relative to the EUV light condenser mirror 23, and reduces variation in the position, posture, and the like of the laser beam condensation optical system 91. Accordingly, the position at which a laser beam is condensed through the laser beam condensation optical system 91 is accurately set relative to the EUV light condenser mirror 23.

The laser beam introduction optical system including the beam splitter 152 and the high reflectance mirror 153 is positioned and fixed to the chamber reference member 9 by the attachment mount 154. This increases the accuracy of positioning of the position, posture, and the like of the laser beam introduction optical system relative to the laser beam condensation optical system 91, and reduces variation in the position, posture, and the like of the laser beam introduction optical system. Accordingly, the position, angle, and the like at which a laser beam is incident on the laser beam condensation optical system 91 are accurately set.

In addition, the laser beam meter 37 is positioned and fixed to the chamber reference member 9 by the attachment mount 154. This increases the accuracy of positioning of the position, posture, and the like of the laser beam meter 37 relative to the laser beam introduction optical system, and reduces variation in the position, posture, and the like. Accordingly, the sectional intensity profile, pointing, divergence, and the like of a laser beam supplied to the laser beam meter 37 through the laser beam introduction optical system can be accurately measured by the meter.

In FIG. 2, an optical path pipe 96 is attached to the chamber reference member 9 through a flexible pipe 98. The optical path pipe 96 is connected with the laser apparatus 3. A high reflectance mirror 97 is disposed in the optical path pipe 96.

Figure 4:
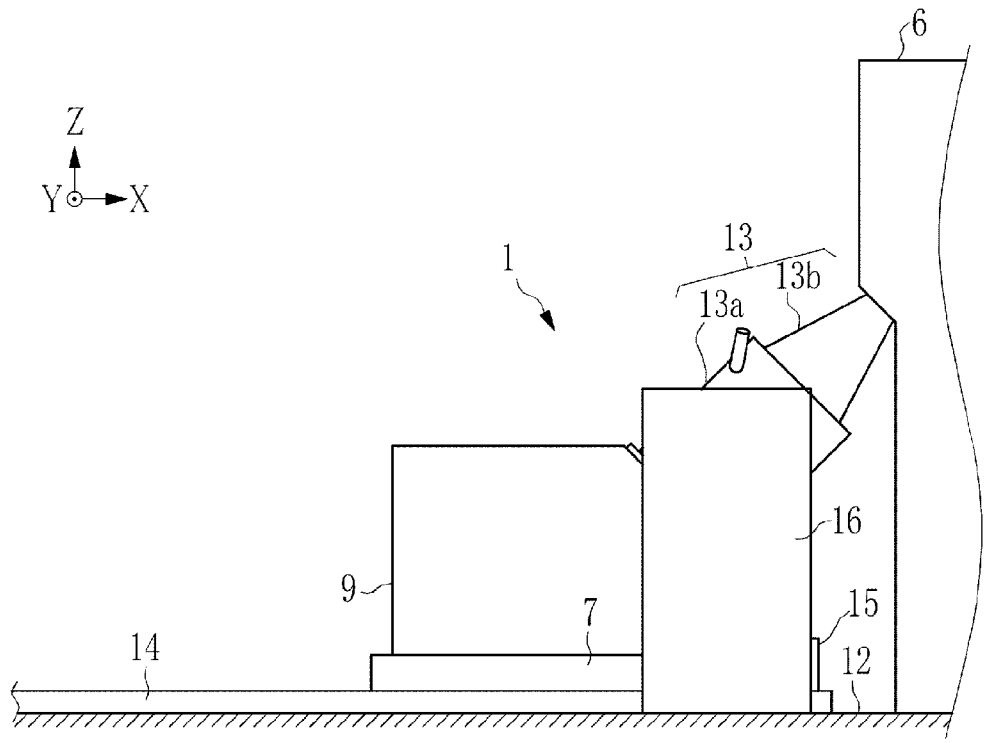
FIG. 4 is an explanatory diagram illustrating a state in which an EUV light generation apparatus according to a comparative example is located at a connection position where the EUV light generation apparatus is connected with the exposure apparatus.

As illustrated in FIGS. 2 and 4, the EUV light generation system 11 includes a pair of magnets 16. The pair of magnets 16 are oppositely disposed with the rail 14 interposed therebetween so that the direction of their magnetic field is aligned with the horizontal direction parallel to the Y axial direction. The vessel 13 enters between the pair of magnets 16 at the connection position at which the vessel 13 is connected with the exposure apparatus 6. The pair of magnets 16 are superconductive magnets that prevent degradation of the EUV light condenser mirror 23 by trapping charged particles generated from plasma generated in the chamber 2 of the vessel 13. The pair of magnets 16 have heavy weight to generate a strong magnetic field. Thus, the pair of magnets 16 are fixed to the floor surface 12.

As illustrated in FIG. 3, the exposure apparatus 6 includes a reflection optical system including a plurality of high reflectance mirrors 6a to 6d. A mask table MT and a workpiece table WT are installed in the exposure apparatus 6. For example, the exposure apparatus 6 emits EUV light on a mask on the mask table MT to project an image of the mask onto a workpiece (such as a semiconductor wafer) on the workpiece table WT. A pattern of the mask is transferred onto the workpiece by moving the mask table MT and the workpiece table WT simultaneously in parallel to each other.

1.2.2 Operation

As illustrated in FIG. 2, a laser beam output from the laser apparatus 3 is reflected by the high reflectance mirror 97 and supplied toward the housing chamber 9b of the chamber reference member 9.

The laser beam supplied into the housing chamber 9b is incident on the beam splitter 152 included in the laser beam introduction optical system. The beam splitter 152 reflects the incident laser beam toward the high reflectance mirror 153 at high reflectance, and transmits part of the incident laser beam toward the laser beam meter 37. The high reflectance mirror 153 reflects the laser beam reflected by the beam splitter 152, and introduces the laser beam into the housing chamber 9a through the window 38.

The laser beam introduced into the housing chamber 9a is incident on the laser beam condensation optical system 91. The laser beam condensation optical system 91 reflects the laser beam and condenses the laser beam to the plasma generation region 25. A target supplied from the target supply device 26 (refer to FIG. 1) is irradiated with the laser beam in the plasma generation region 25 to generate plasma from the target, and then radiation light including EUV light is generated from the plasma. The EUV light is condensed by the EUV light condenser mirror 23 and output to the exposure apparatus 6 through the intermediate focus point 292.

1.3 Description of Replacement Procedure of EUV Light Condenser Mirror

Figure 5:
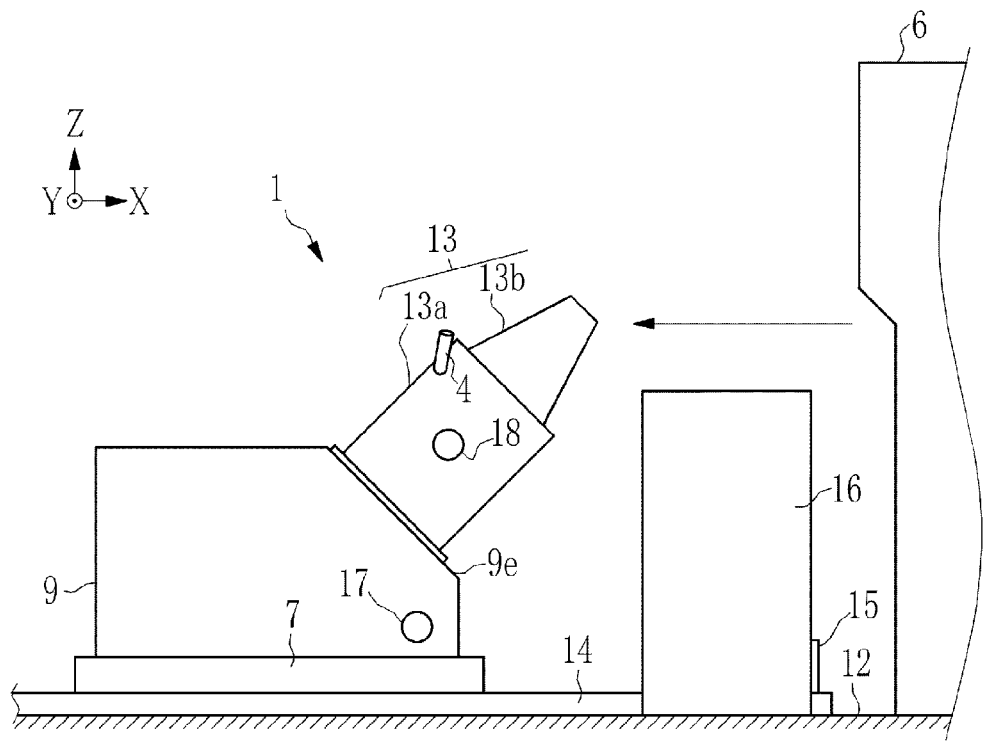
FIG. 5 is an explanatory diagram illustrating a state in which the EUV light generation apparatus according to the comparative example is shifted out from the exposure apparatus.

FIGS. 4 to 10 are explanatory diagrams of a replacement procedure of the EUV light condenser mirror 23. At the connection position illustrated in FIG. 4, the pair of magnets 16 and the exposure apparatus 6 are disposed around the EUV light generation apparatus 1. When the EUV light condenser mirror 23 is to be replaced, first, a work space is obtained by performing shift out to move the EUV light generation apparatus 1 from the connection position illustrated in FIG. 4 along the rail 14 in a direction departing from the exposure apparatus 6 as illustrated in FIG. 5. Thus, the work space is obtained around the EUV light generation apparatus 1.

Subsequently, a crane 41 is used to tilt up the chamber reference member 9 and remove the vessel 13. When a posture illustrated in FIGS. 4 and 5 is a normal posture of the EUV light generation apparatus 1, the attachment surface 9e to which the vessel 13 is attached is tilted relative to the horizontal direction in the normal posture. The attachment surface 9e needs to be made horizontal first before removing the vessel 13.

This is because the axial direction of the vessel 13 is tilted relative to the horizontal direction while the vessel 13 is attached to the attachment surface 9e, and when the vessel 13 is hung by the crane 41 while the vessel 13 is tilted in this manner, the posture of the vessel 13 being hung by the crane 41 is unstable in extremely poor balance. When the attachment surface 9e is made horizontal, the axial direction of the vessel 13 orthogonal to the attachment surface 9e becomes vertical. Accordingly, the vessel 13 can be hung in a stable posture.

When used, the crane 41 is attached to the vessel 13, and the target sensor 4 protruding from the outer peripheral surface of the vessel 13 is removed. Although not illustrated as described above, the target supply device 26 and the target collection unit 28 are provided on the outer peripheral surface of the vessel 13, and thus these components are removed as necessary.

Figure 6:
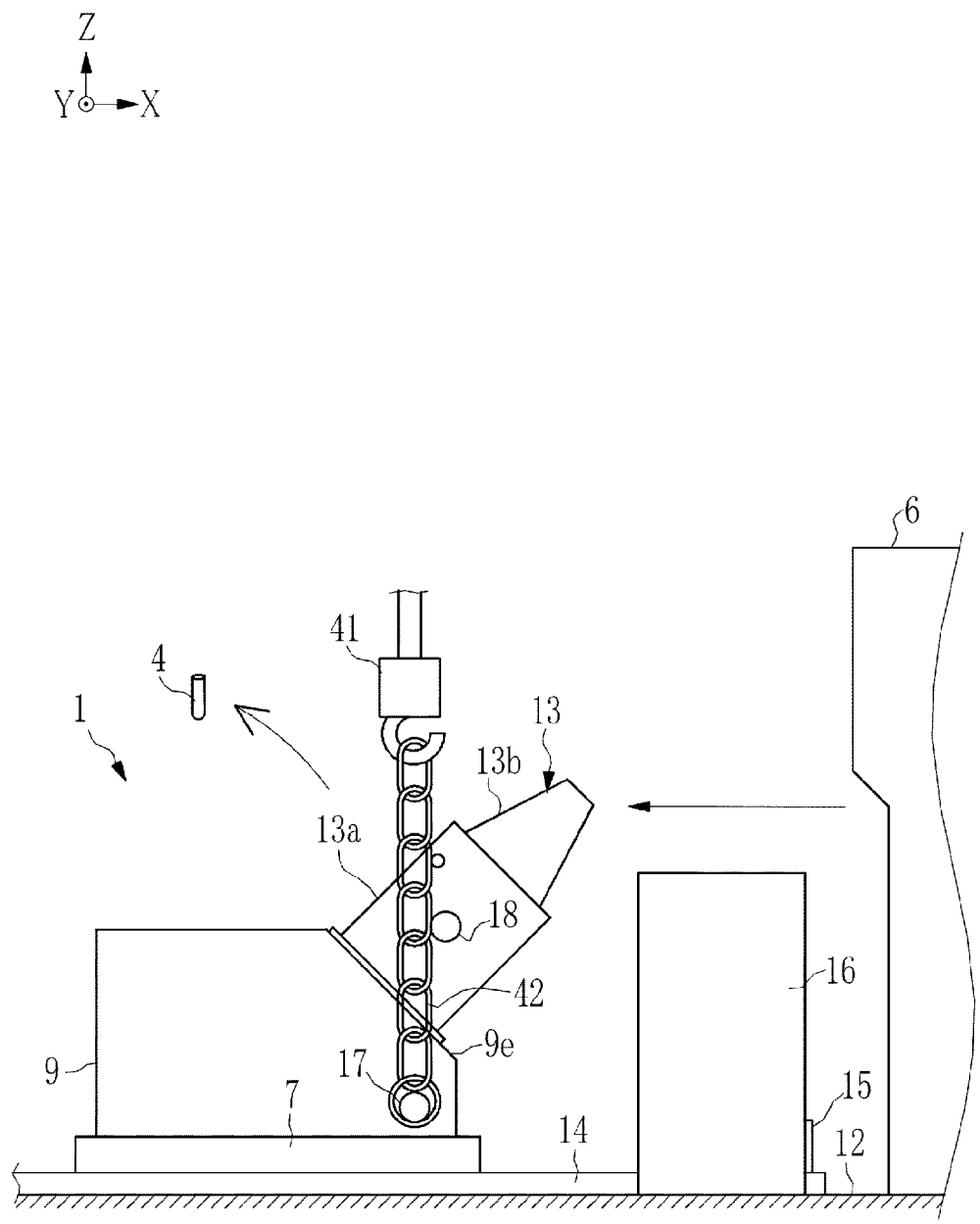
FIG. 6 is an explanatory diagram illustrating a state in which a crane is attached to a chamber reference member of the EUV light generation apparatus according to the comparative example.
Figure 7:
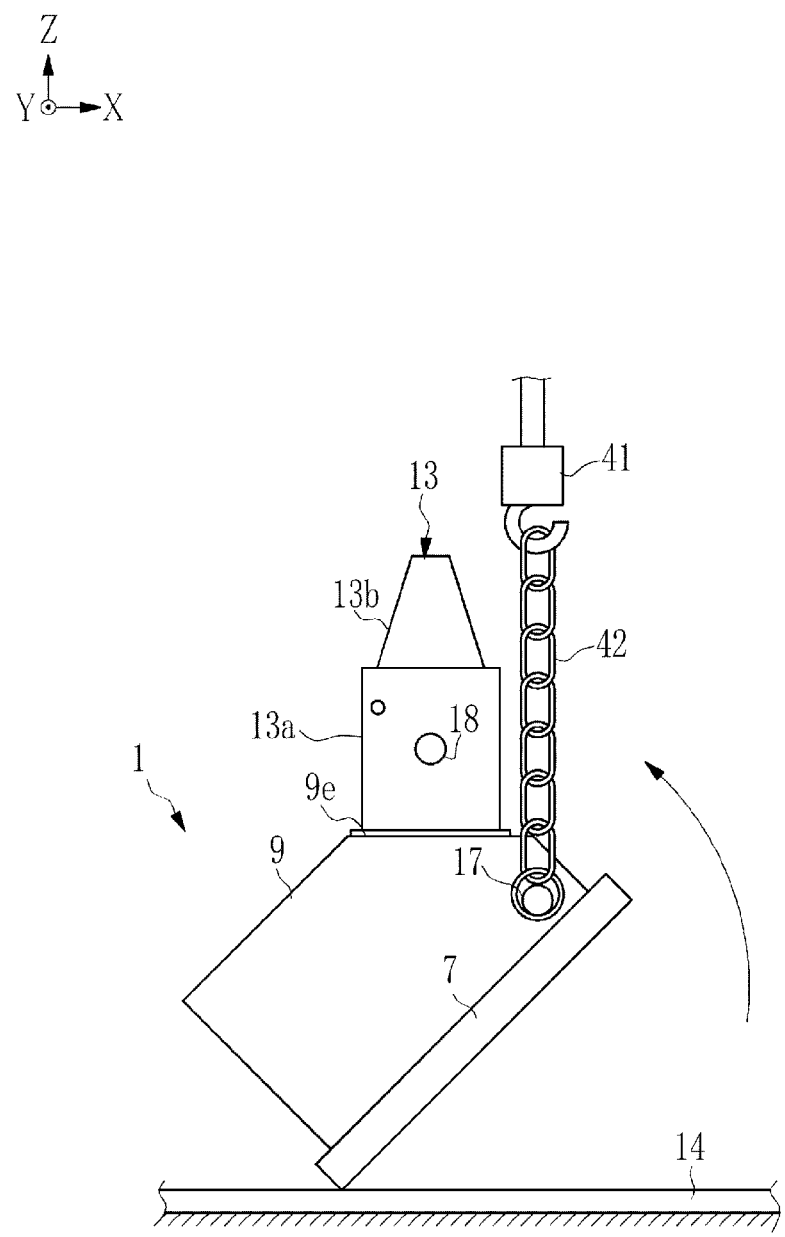
FIG. 7 is an explanatory diagram illustrating a state in which the crane tilts up the EUV light generation apparatus according to the comparative example.

After a component such as the target sensor 4 is removed from the vessel 13, one end of chains 42 attached to the crane 41 is hooked to each of the convex portions 17 on both side surfaces of the chamber reference member 9 as illustrated in FIG. 6. Then, as illustrated in FIG. 7, tilt up is performed to tilt the chamber reference member 9 upward by pulling the front side of the chamber reference member 9 upward by the crane 41. Accordingly, the attachment surface 9e becomes horizontal, and the axial direction of the vessel 13 becomes vertical to the horizontal direction and aligned with the Z axial direction.

Figure 8:
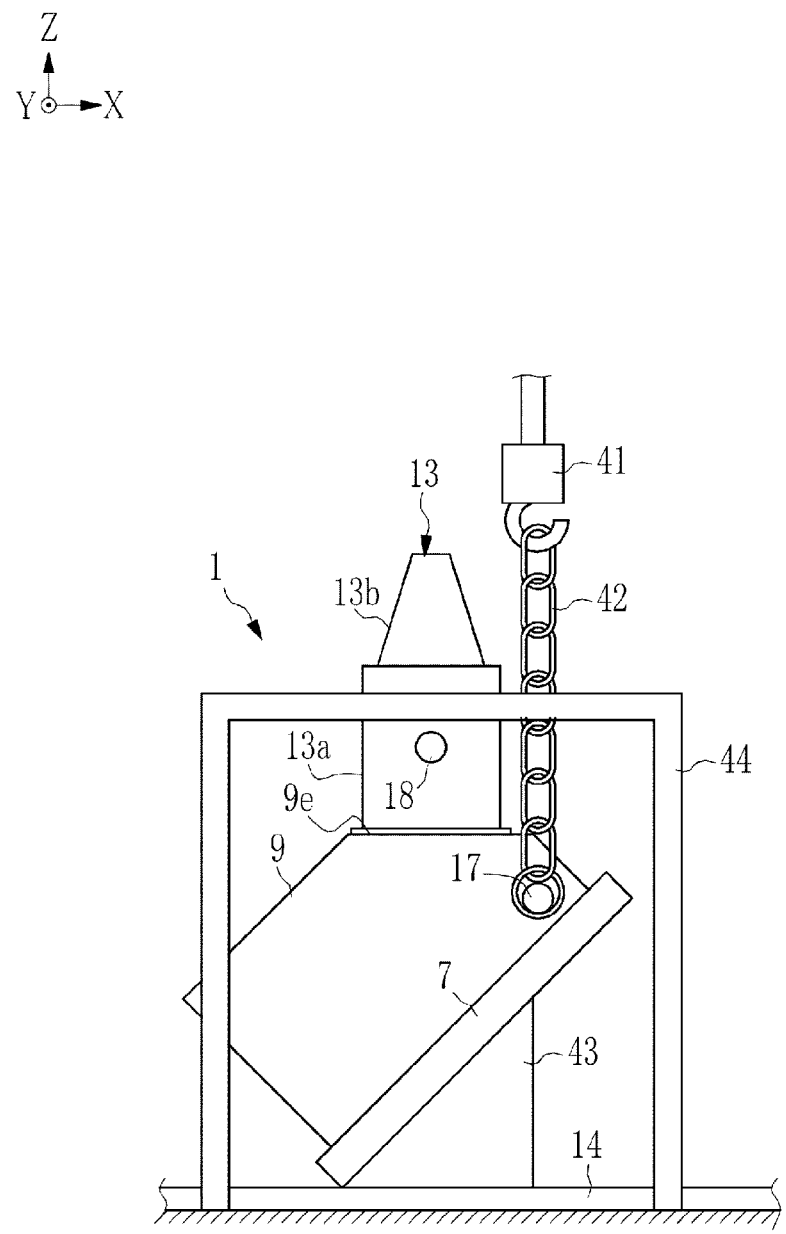
FIG. 8 is an explanatory diagram illustrating a state in which a supporting table and a mount are installed for the EUV light generation apparatus according to the comparative example.

Thereafter, as illustrated in FIG. 8, a support mount 43 is installed to maintain the EUV light generation apparatus 1 in the tilted-up posture. In addition, a mount 44 is installed around the EUV light generation apparatus 1. The mount 44 is a table on which the vessel 13 removed from the chamber reference member 9 is placed.

Figure 9:
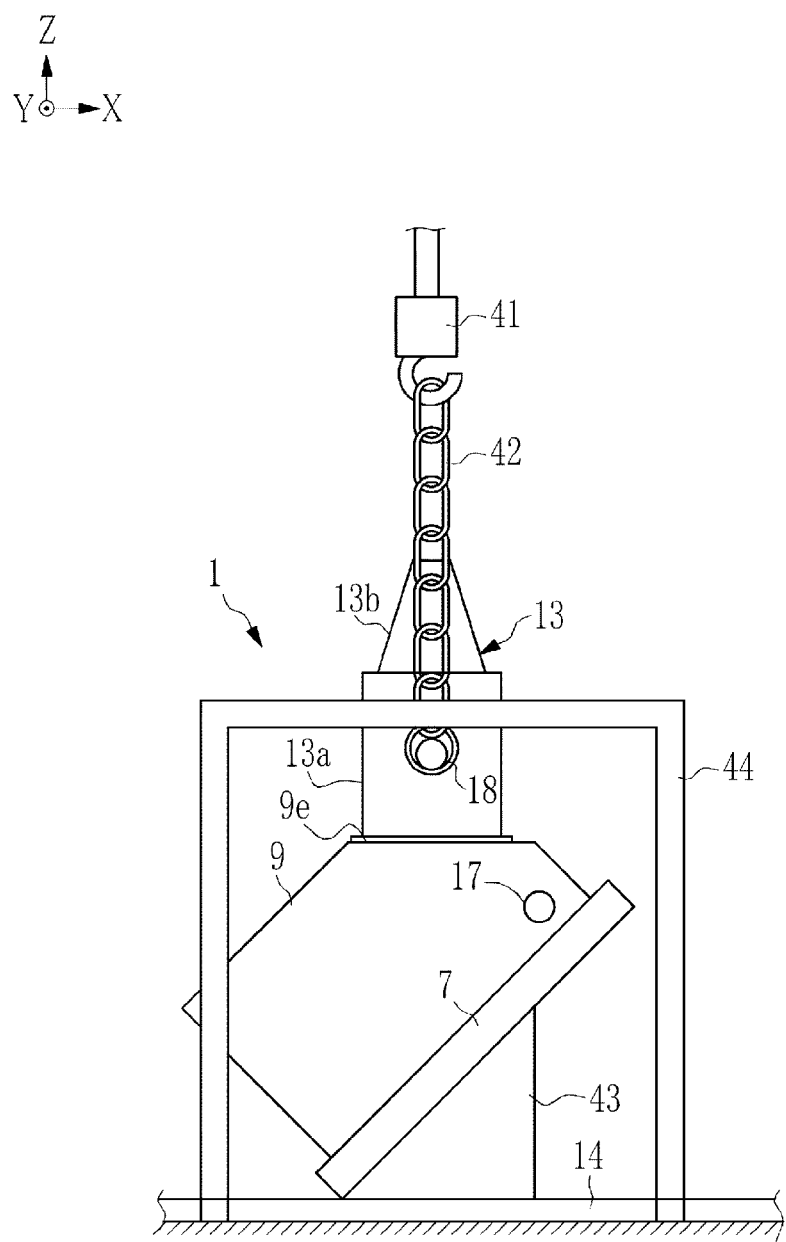
FIG. 9 is an explanatory diagram illustrating a state in which the crane is attached to a vessel of the EUV light generation apparatus according to the comparative example.
Figure 10:
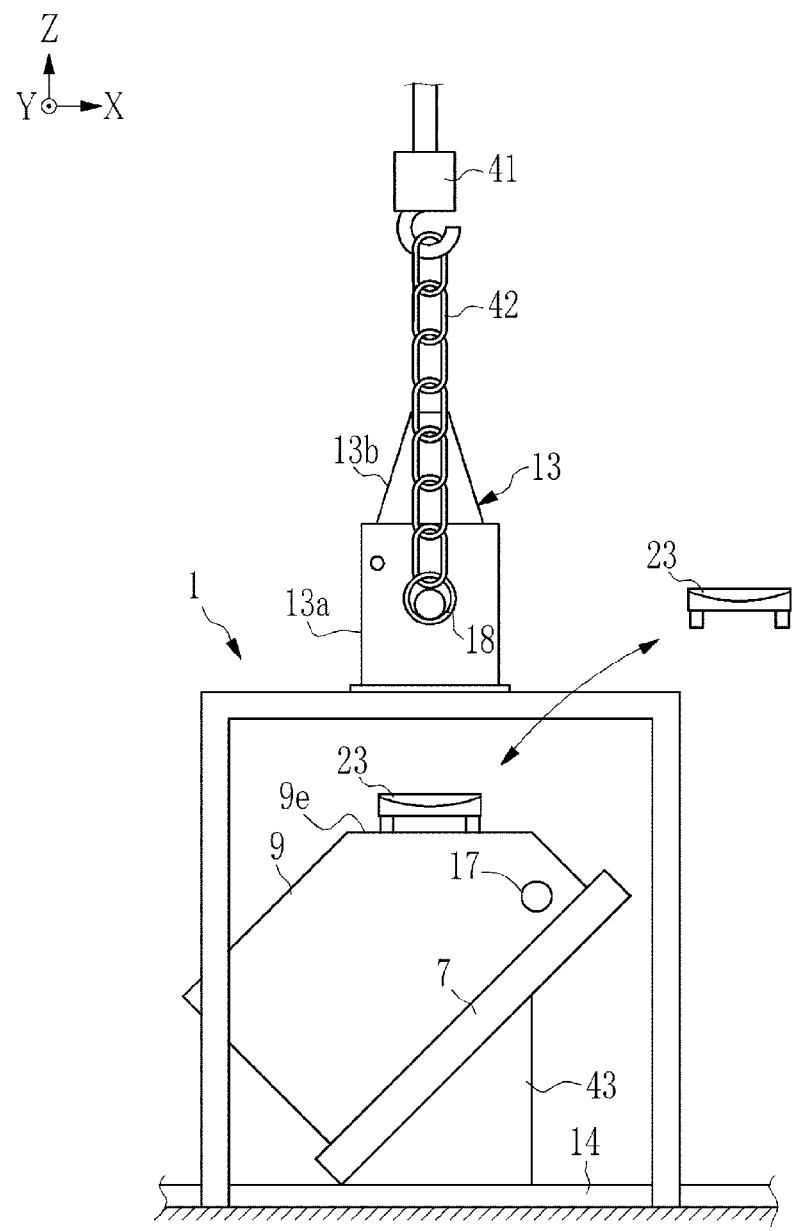
FIG. 10 is an explanatory diagram illustrating a state in which the vessel is separated from the chamber reference member in the EUV light generation apparatus according to the comparative example.
Figure 11:
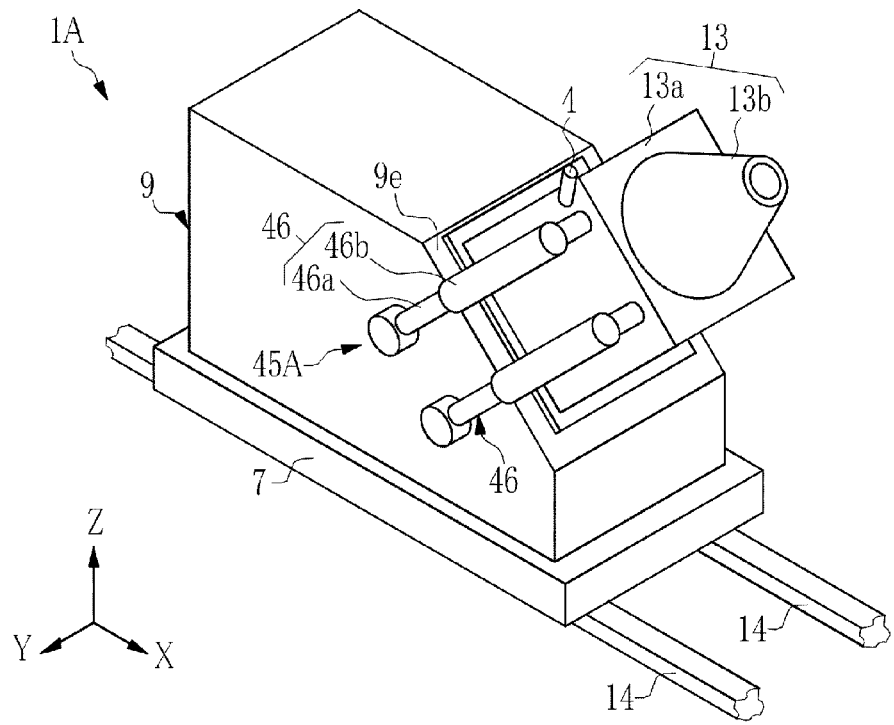
FIG. 11 is an external perspective view of a state in which the vessel is located at a first position in an EUV light generation apparatus according to a first embodiment.
Figure 12:
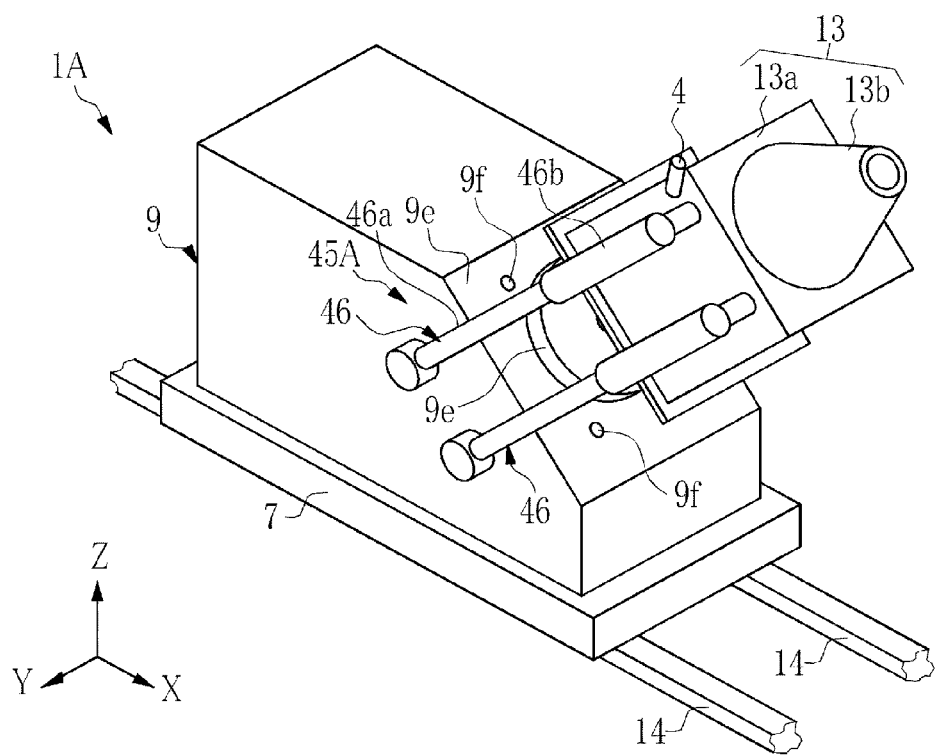
FIG. 12 is an external perspective view of a state in which the vessel is located at a second position in the EUV light generation apparatus according to the first embodiment.

After the mount 44 is installed, as illustrated in FIG. 9, the chains 42 being hooked to the convex portions 17 of the chamber reference member 9 are hooked to the convex portions 18 of the vessel 13. After the chains 42 are hooked to the convex portions 18, as illustrated in FIG. 10, the vessel 13 is hung upward by the crane 41 and separated from the attachment surface 9e. The vessel 13 being separated from the attachment surface 9e is placed on the mount 44.

The EUV light condenser mirror 23 being covered by the vessel 13 is externally exposed when the vessel 13 is separated from the attachment surface 9e. In this state, the EUV light condenser mirror 23 is replaced. In addition, maintenance work such as replacement of another component is performed as necessary.

After the replacement work is ended, attachment of the vessel 13 to the attachment surface 9e and removal of the mount 44 and the support mount 43 are performed. Thereafter, the posture of the EUV light generation apparatus 1 is returned to the normal posture illustrated in FIG. 6 by using the crane 41. In this state, the crane 41 is removed from the chamber reference member 9, and the target sensor 4 and the like are attached to the vessel 13. Position adjustment is performed on the target sensor 4 being attached. After the position adjustment ends, the EUV light generation apparatus 1 is moved to the connection position illustrated in FIG. 4 through traveling on the rail 14. Then, the exposure apparatus 6 is connected with the connection unit 13b of the vessel 13. This completes the replacement work of the EUV light condenser mirror 23.

1.4 Problem

As described in the comparative example, the replacement work of the EUV light condenser mirror 23 involves separation work of separating the vessel 13 from the attachment surface 9e of the chamber reference member 9 by using the crane 41. When the crane 41 is used, the replacement work of the EUV light condenser mirror 23 takes an extremely long time, which leads to a long down time during which the EUV light generation system 11 cannot be operated.

This is because, as described with reference to FIGS. 4 to 10, the tilt-up work of the chamber reference member 9, the installation work of the support mount 43 and the mount 44, and the component removal work of removing a component such as the target sensor 4 from the vessel 13 are needed as preparation work for separation of the vessel 13 when the crane 41 is used. In the EUV light generation apparatus 1, the weight of the vessel 13 by itself reaches several hundred kg, and thus an extremely long time is taken for work of tilting up and hanging such a heavy weight object.

In addition, once a component such as the target sensor 4 is removed from the vessel 13, position adjustment is needed to attach the component again. As described above, in the EUV light generation apparatus 1, high accuracy is requested for positioning of the optical system for a laser beam and EUV light. In addition, extremely high accuracy is requested for positioning of a component such as the target sensor 4, and thus an extremely long time is taken for the position adjustment. Specifically, when the EUV light condenser mirror 23 is replaced by using the crane 41, the total work time reaches 10 hours approximately or longer. In addition, work of handling a heavy weight object such as the vessel 13 tends to require a larger number of preparation steps and a large number of staff necessary for surrounding safety check or the like, and thus labor of the work increases.

Thus, it is needed to shorten the down time due to the replacement work of the EUV light condenser mirror 23 and reduce labor of the replacement work.

2. First Embodiment

The following describes an EUV light generation apparatus 1A according to a first embodiment of the present disclosure with reference to FIGS. 11 to 22. The overall configurations of the EUV light generation apparatus 1 described in the comparative example and the EUV light generation system including the EUV light generation apparatus 1 are substantially same in the first embodiment. The first embodiment and the comparative example are different from each other mainly in that the EUV light generation apparatus 1A includes a vessel movement mechanism 45A configured to move the vessel 13. The description of the first embodiment is mainly made on the difference from the comparative example. Hereinafter, any component identical to that of the comparative example is denoted by an identical reference sign, and description thereof will be omitted as appropriate.

2.1 Description of EUV Light Generation Apparatus of the First Embodiment 2.1.1 Configuration of Vessel Movement Mechanism As illustrated in FIGS. 11 to 15, the vessel movement mechanism 45A separates the vessel 13 from the attachment surface 9e of the chamber reference member 9 by moving the vessel 13 in the axial direction of the vessel 13. Specifically, the vessel movement mechanism 45A moves the vessel 13 between a first position illustrated in FIGS. 11 and 13 and a second position illustrated in FIGS. 12 and 14. The first position is a position at which the vessel 13 covers the EUV light condenser mirror 23, and the second position is a position at which the vessel 13 is retracted from the first position to externally expose the EUV light condenser mirror 23. In the present example, the vessel 13 contacts the attachment surface 9e at the first position, and the vessel 13 is separated from the attachment surface 9e at the second position.

Figure 13:
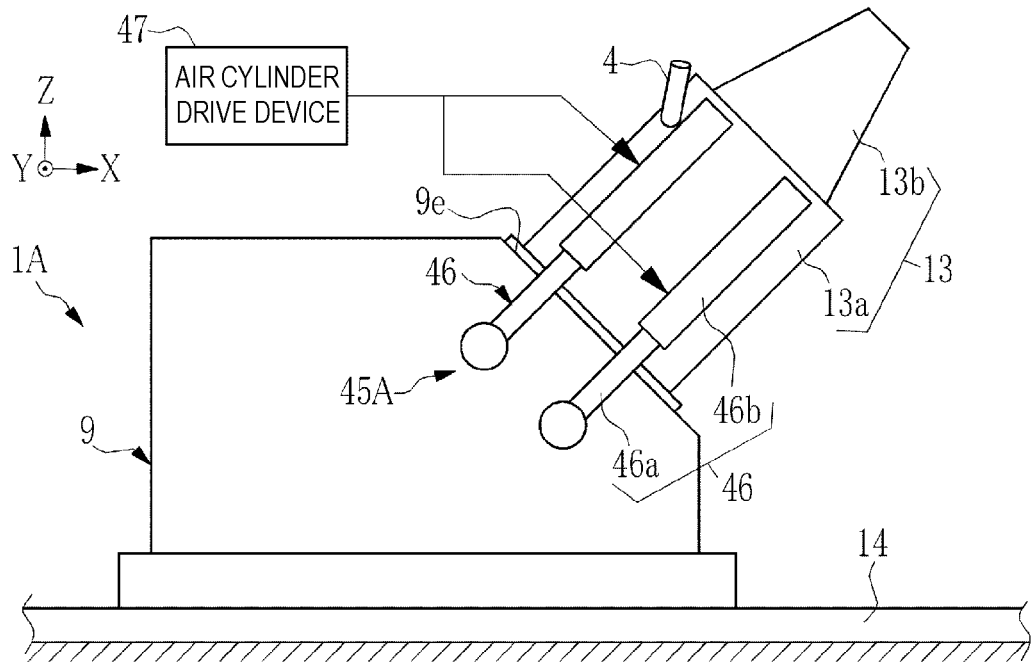
FIG. 13 is a side view of the state in which the vessel is located at the first position in the EUV light generation apparatus according to the first embodiment.
Figure 14:
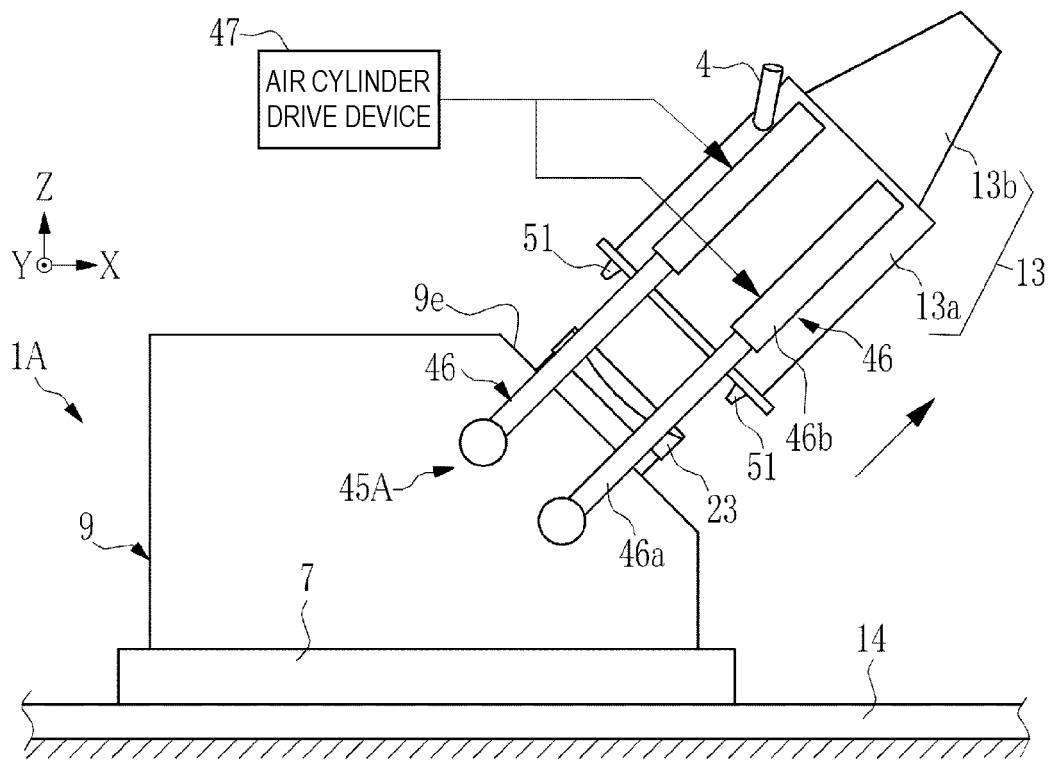
FIG. 14 is a side view of the state in which the vessel is located at the second position in the EUV light generation apparatus according to the first embodiment.
Figure 15:
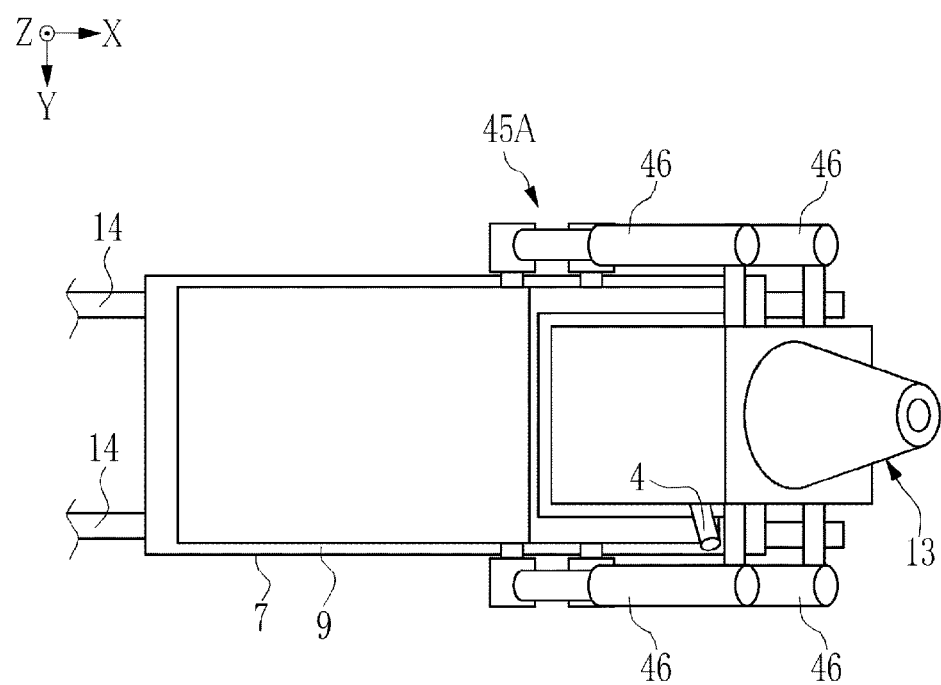
FIG. 15 is a plan view of the EUV light generation apparatus according to the first embodiment.

The vessel movement mechanism 45A includes an air cylinder 46 corresponding to a link member, and an air cylinder drive device 47 illustrated in FIGS. 13 and 14. As illustrated in FIG. 15, for example, the four air cylinders 46 are provided in total with two of them being disposed on each side of the vessel 13.

As illustrated in FIGS. 11 to 14, the air cylinder 46 includes a piston rod 46a that functions as a main shaft, and a cylinder 46b that functions as a slide member configured to slide relative to the piston rod 46a in the axial direction of the piston rod 46a. As publicly known, the length of the air cylinder 46 in the axial direction is expanded by supplying compression air into the cylinder 46b and contracted by discharging the compression air from the cylinder 46b.

The piston rod 46a has one end attached to the chamber reference member 9, and the cylinder 46b has one end attached to the vessel 13. The air cylinder 46 expands and contracts in the axial direction through relative slide between the piston rod 46a and the cylinder 46b. The air cylinder 46 moves the vessel 13 relative to the chamber reference member 9 through this expansion and contraction operation.

As illustrated in FIGS. 13 and 14, the air cylinder 46 is disposed in a posture in which the axial direction of the air cylinder 46 is aligned with the axial direction of the vessel 13. Thus, when the air cylinder 46 expands and contracts, the vessel 13 moves up and down between the first position and the second position in the axial direction of the vessel 13. Specifically, the vessel 13 moves to the first position illustrated in FIGS. 11 and 13 when the air cylinder 46 contracts, and the vessel 13 moves to the second position illustrated in FIGS. 12 and 14 when the air cylinder 46 expands.

As illustrated in FIGS. 13 and 14, the air cylinder 46 is driven by the air cylinder drive device 47. The air cylinder drive device 47 is a compression air supply and discharge device configured to supply and discharge compression air to and from the air cylinder 46. The air cylinder drive device 47 may be a device dedicated to the EUV light generation apparatus 1A, or may be a compression air supply and discharge device deployed in advance as a shared facility that can be used for another device in a clean room in which the EUV light generation apparatus 1A is installed.

2.1.2 Configuration of Positioning Mechanism

Figure 16:
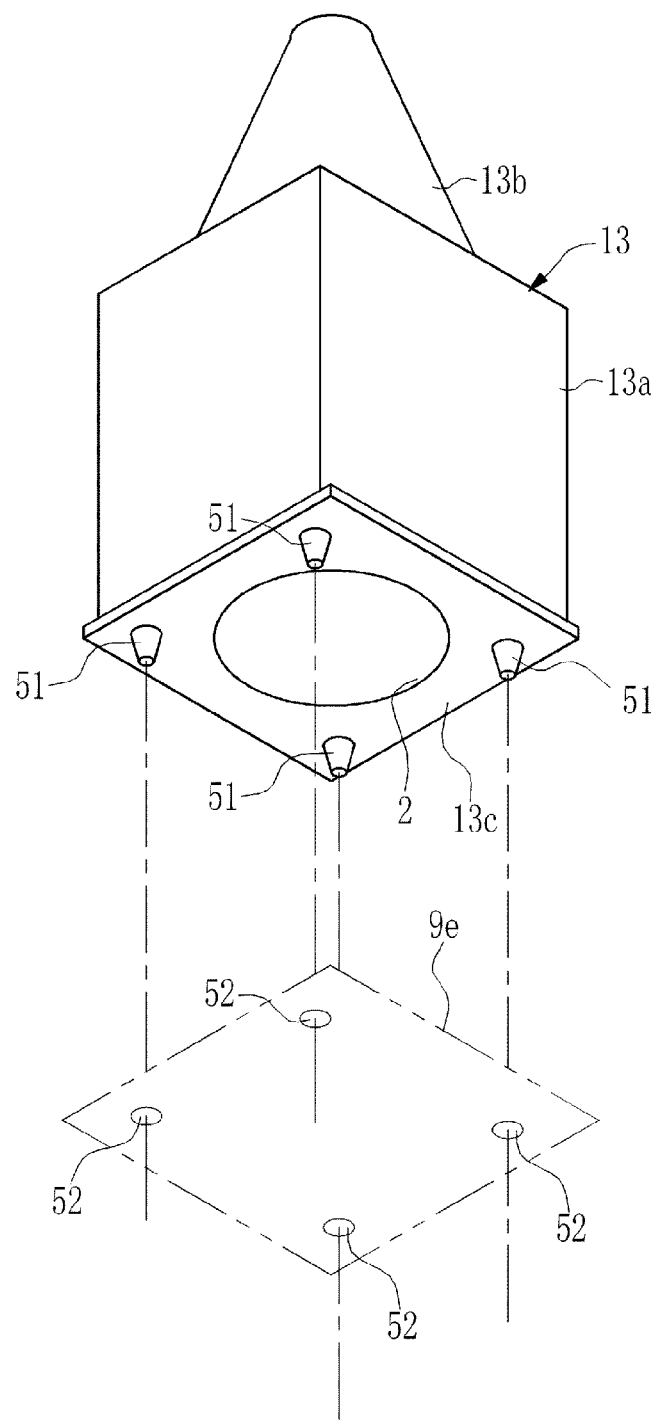
FIG. 16 is an external perspective view illustrating taper pins as a positioning mechanism of the vessel.

The EUV light generation apparatus 1A is provided with a positioning mechanism configured to position the vessel 13 relative to the chamber reference member 9. As illustrated in FIG. 16, the positioning mechanism of the present example includes a taper pin 51, and an engagement hole 52 to be engaged with the taper pin 51. For example, the four taper pins 51 in total are provided at four respective corners of an end face 13c of the body part 13a of the vessel 13 facing the attachment surface 9e. A circular opening of the chamber 2 is formed at the end face 13c, and the taper pins 51 are disposed around the opening. The attachment surface 9e is provided with the four engagement holes 52 at positions corresponding to the four taper pins 51.

Figure 17:
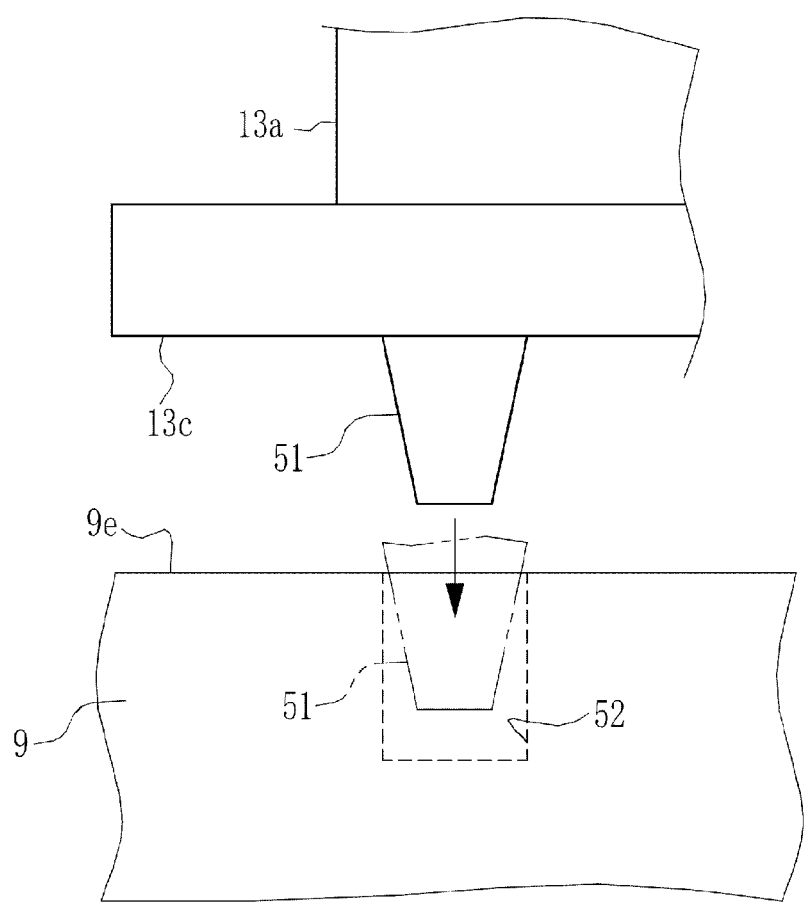
FIG. 17 is a side view illustrating a state in which each taper pin illustrated in FIG. 16 is engaged with an engagement hole.

As illustrated in FIG. 17, each taper pin 51 has a substantially circular truncated cone shape having a diameter that is small on the leading end side and increases toward the base end side. The diameter of the taper pin 51 on the base end side is substantially equal to the diameter of the engagement hole 52. This facilitates insertion of the leading end of the taper pin 51 into the engagement hole 52. As the taper pin 51 is moved deeper into the engagement hole 52 as illustrated with a dashed and double-dotted line, the taper pin 51 is guided through contact of the outer peripheral surface of the taper pin 51 with the engagement hole 52, and accordingly, the center of the taper pin 51 in the radial direction coincides with the center of the engagement hole 52 in the radial direction. In this manner, the vessel 13 can be accurately positioned relative to the chamber reference member 9.

2.1.3 Ring Groove of O Ring

Figure 18:
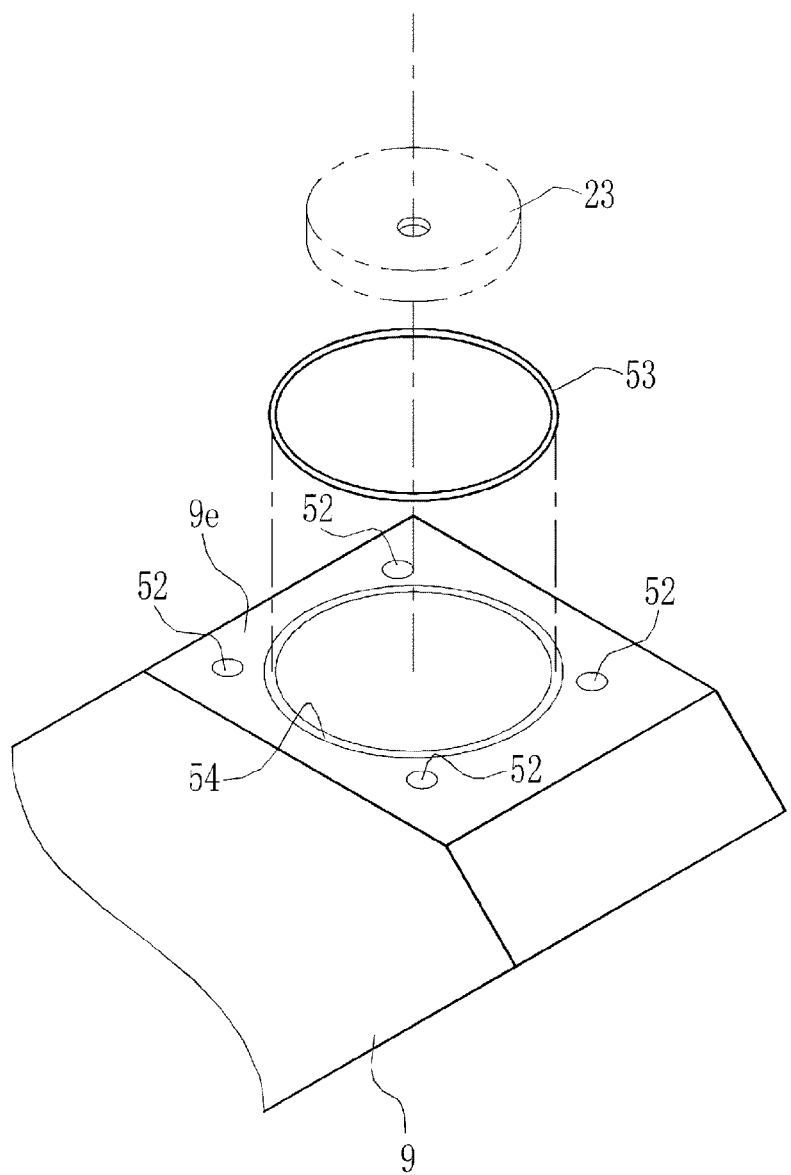
FIG. 18 is a perspective view illustrating an O ring and a ring groove.

As illustrated in FIG. 18, an O ring 53 is attached to the attachment surface 9e of the chamber reference member 9. The diameter of the O ring 53 is slightly larger than the diameter of the opening of the chamber 2. The O ring 53 seals the gap between the attachment surface 9e and the end face 13c of the body part 13a. Accordingly, the inside of the chamber 2 is sealed when the vessel 13 is located at the first position at which the end face 13c contacts the attachment surface 9e. The attachment surface 9e is provided with a circular ring groove 54 to which the O ring 53 is attached.

Figure 19:
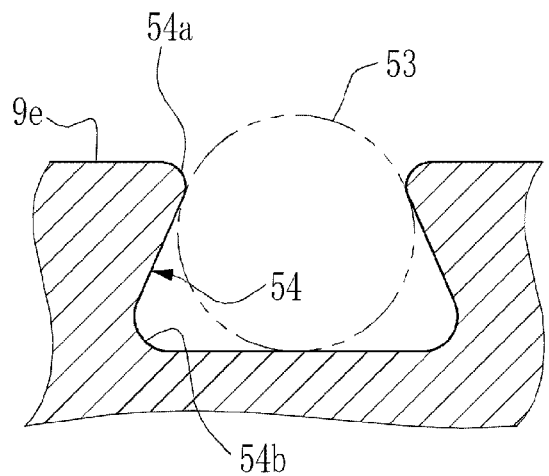
FIG. 19 is a cross-sectional view of the ring groove.

As illustrated in FIG. 19, the sectional shape of the ring groove 54, which is orthogonal to the circumferential direction is a substantially trapezoid shape in which the width of an opening 54a as the entrance of the ring groove 54 is narrower than that of an inside 54b of the ring groove 54. The width of the opening 54a is smaller than the diameter of the O ring 53. Such a ring groove 54 is called, for example, a dovetail groove. When the O ring 53 is attached to the ring groove 54, the O ring 53 elastically deforms to enter to the inside 54b through the opening 54a. Once attached to the ring groove 54, the O ring 53 is unlikely to come off due to the narrow width of the opening 54a.

While the vessel 13 is attached to the chamber reference member 9, the end face 13c of the body part 13a closely contacts the O ring 53 on the attachment surface 9e. Since the O ring 53 is unlikely to come off from the ring groove 54, the O ring 53 is prevented from sticking to the end face 13c of the vessel 13 and coming off from the ring groove 54 when the vessel 13 is separated from the attachment surface 9e.

2.2 Description of Replacement Procedure of EUV Light Condenser Mirror

Figure 20:
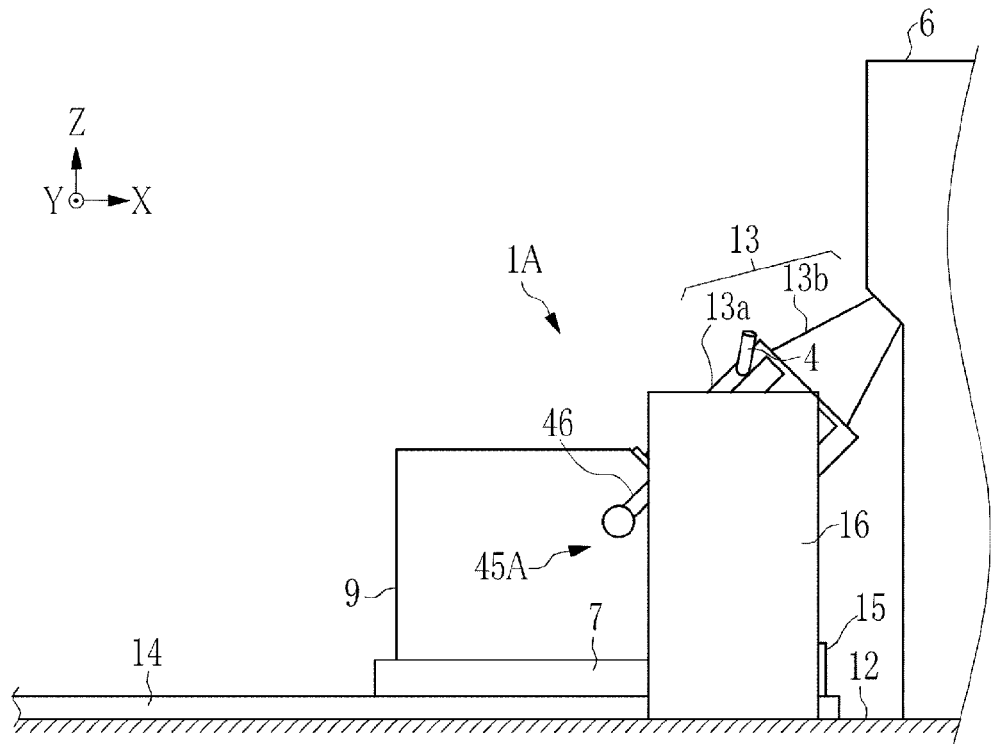
FIG. 20 is an explanatory diagram illustrating a state in which the EUV light generation apparatus according to the first embodiment is located at the connection position where the EUV light generation apparatus is connected with the exposure apparatus.
Figure 21:
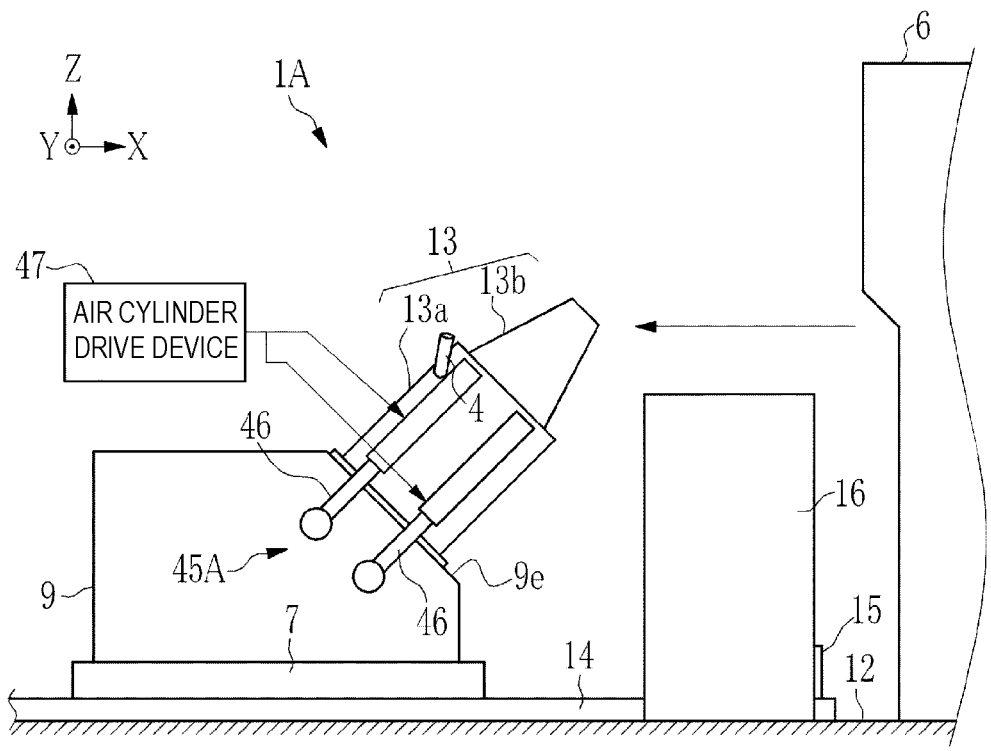
FIG. 21 is an explanatory diagram illustrating a state in which the EUV light generation apparatus according to the first embodiment is shifted out from the exposure apparatus.
Figure 22:
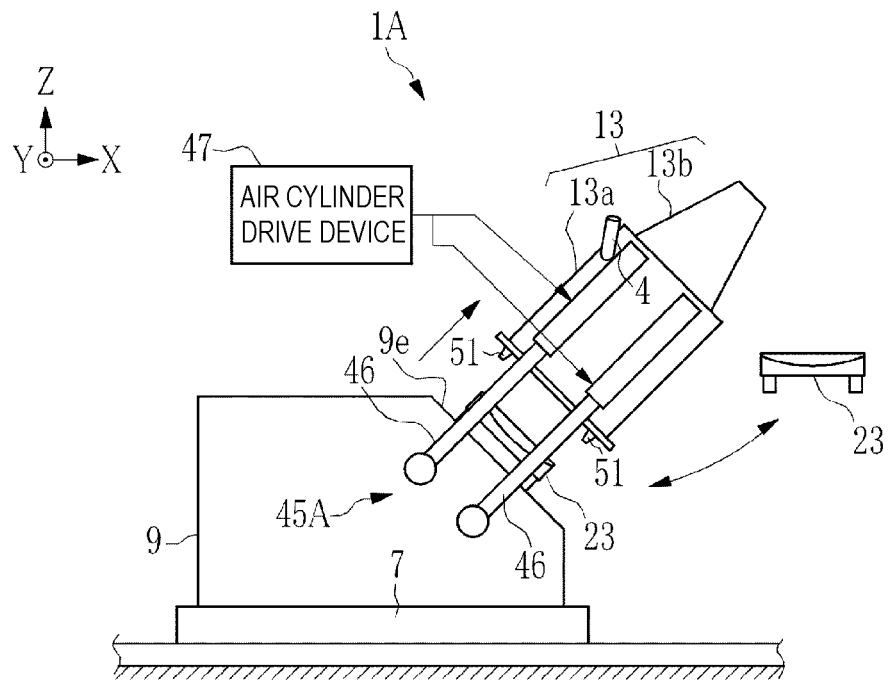
FIG. 22 is an explanatory diagram of a state in which the vessel is moved to the second position in the EUV light generation apparatus according to the first embodiment.

The following describes the replacement procedure of the EUV light condenser mirror 23 in the EUV light generation apparatus 1A of the first embodiment with reference to FIGS. 20 to 22. Similarly to the comparative example, the EUV light generation apparatus 1A is shifted out from the connection position illustrated in FIG. 20 toward the back side through traveling on the rail 14 as illustrated in FIG. 21.

Thereafter, each air cylinder drive device 47 is mounted on the corresponding air cylinder 46.

When the air cylinder drive device 47 is actuated and compression air is supplied to the air cylinder 46, the vessel 13 moves from the first position illustrated in FIG. 21 to the second position illustrated in FIG. 22. Accordingly, the EUV light condenser mirror 23 being covered by the vessel 13 at the first position is externally exposed as illustrated in FIG. 22.

In this state, the used EUV light condenser mirror 23 is replaced with a new EUV light condenser mirror 23. When the replacement work ends, the air cylinder drive device 47 is actuated to discharge the compression air from the air cylinder 46. Accordingly, the vessel 13 moves from the second position to the first position, and the EUV light condenser mirror 23 is covered by the vessel 13 and housed in the chamber 2. The vessel 13 is positioned at an appropriate position relative to the chamber reference member 9 through engagement between each taper pin 51 and the corresponding engagement hole 52.

2.3 Effect 2.3.1 Effect of Vessel Movement Mechanism

Since the EUV light generation apparatus 1A of the first embodiment includes the vessel movement mechanism 45A, the replacement work of the EUV light condenser mirror 23 can be performed without using the crane 41. As illustrated in FIGS. 6 to 9 of the comparative example, the tilt-up work of the chamber reference member 9, the installation work of the support mount 43 and the mount 44, and the removal work of the target sensor 4 or the like from the vessel 13 are needed as preparation work for separation of the vessel 13 from the chamber reference member 9 when the crane 41 is used. Since the EUV light generation apparatus 1A of the first embodiment includes the vessel movement mechanism 45A, such preparation work is unnecessary.

In addition, since the crane 41 does not need to be attached to the vessel 13 in the replacement work, a component such as the target sensor 4 does not need to be removed from the vessel 13. Thus, position adjustment does not need to be performed when the component such as the target sensor 4 is attached to the vessel 13 again. Since the preparation work and the component position adjustment are unnecessary, the replacement work of the EUV light condenser mirror 23 can be performed in a shorter time than in the comparative example. In addition, since the crane 41 is not used, the number of staff necessary for the work can be reduced, and labor of the work can be reduced.

Thus, with the EUV light generation apparatus 1A of the first embodiment, it is possible to shorten the down time of the EUV light generation system 11 and reduce labor of the replacement work of the EUV light condenser mirror 23 as compared to the comparative example.

In particular, it is effective to provide the vessel movement mechanism 45A when the attachment surface 9e for the EUV light condenser mirror 23 is not horizontal but is tilted relative to the horizontal direction in the normal posture as in the EUV light generation apparatus 1A of the present example. This is because of the following reason. When the attachment surface 9e is tilted, the tilt-up work of the chamber reference member 9 and the installation work of the support mount 43 and the mount 44 are needed to make the attachment surface 9e horizontal and remove the vessel 13 in a stable posture as illustrated in FIGS. 7 and 8 of the comparative example. Thus, when the attachment surface 9e is tilted, more preparation work is needed and a longer time is taken for the replacement work as compared to when the attachment surface 9e is horizontal, and thus the necessity for reduction of the work time is high.

The vessel movement mechanism 45A of the present example is a linear movement mechanism configured to move the vessel 13 between the first position and the second position through linear movement. Thus, the configuration of the vessel movement mechanism 45A can be relatively simplified.

2.3.2 Effect of Air Cylinder

Each air cylinder 46 uses compression air as the source of drive power. Thus, contamination is less concerned as compared to, for example, a hydraulic pressure cylinder that uses oil in place of compression air. Thus, the air cylinder 46 is more preferable than a hydraulic pressure cylinder when used in the EUV light generation apparatus 1A installed in a clean room.

Since a link member including a main shaft and a slide member configured to relatively slide in the axial direction of the main shaft, like the air cylinder 46, is used as the vessel movement mechanism 45A, the configuration of the movement mechanism can be simplified as compared to when a link member in which a plurality of rods are combined in a complicated manner is used.

2.3.3 Effect of Ring Groove

The O ring 53 that closely contacts the end face 13c of the vessel 13 at the first position is attached to the ring groove 54 having a substantially trapezoid sectional shape. Thus, when the end face 13c of the vessel 13 is separated from the attachment surface 9e, the O ring 53 is prevented from coming off from the ring groove 54 while adhering to the end face 13c of the vessel 13. When the O ring 53 comes off from the ring groove 54 at separation of the vessel 13, increased amounts of time and labor are needed for work of mounting the O ring 53 again. With the ring groove 54 from which the O ring 53 is unlikely to come off, it is possible to further reduce the time and labor of the replacement work of the EUV light condenser mirror 23.

2.3.4 Effect of Positioning Mechanism

Since the taper pins 51 each having a diameter that is smaller on the leading end side and larger on the base end side are used as the positioning mechanism, it is easy to insert each taper pin 51 into the corresponding engagement hole 52. In addition, when the initial engagement position is somewhat shifted, positioning is automatically performed as the taper pin 51 is inserted deeper into the engagement hole 52. Thus, positioning work is easier than when a straight pin having a constant diameter from the leading end to the base end is used. The easier positioning work leads to further reduction of the time and labor of the replacement work of the EUV light condenser mirror 23.

2.4 Other

The number of the air cylinders 46 is four in the above example but can be changed as appropriate in accordance with a load on each air cylinder 46 in accordance with the weight of the vessel 13 and the like. In the method of attaching the air cylinder 46, unlike the above example, the cylinder 46b may be attached to the chamber reference member 9, and the piston rod 46a may be attached to the vessel 13.

The taper pins 51 of the positioning mechanism are provided to the vessel 13 in the above example but may be provided instead to the chamber reference member 9 whereas the engagement holes 52 may be provided to the vessel 13.

The ring groove 54 is provided to the chamber reference member 9 in the above example but may be provided to the end face 13c of the vessel 13.

The outer shape of the vessel 13 is a rectangular tubular shape having a rectangular section in the above example but may be a rectangular tubular shape having a polygonal section such as a hexagonal section or an octagonal section or may be a cylindrical shape.

3. Second Embodiment

Figure 23:
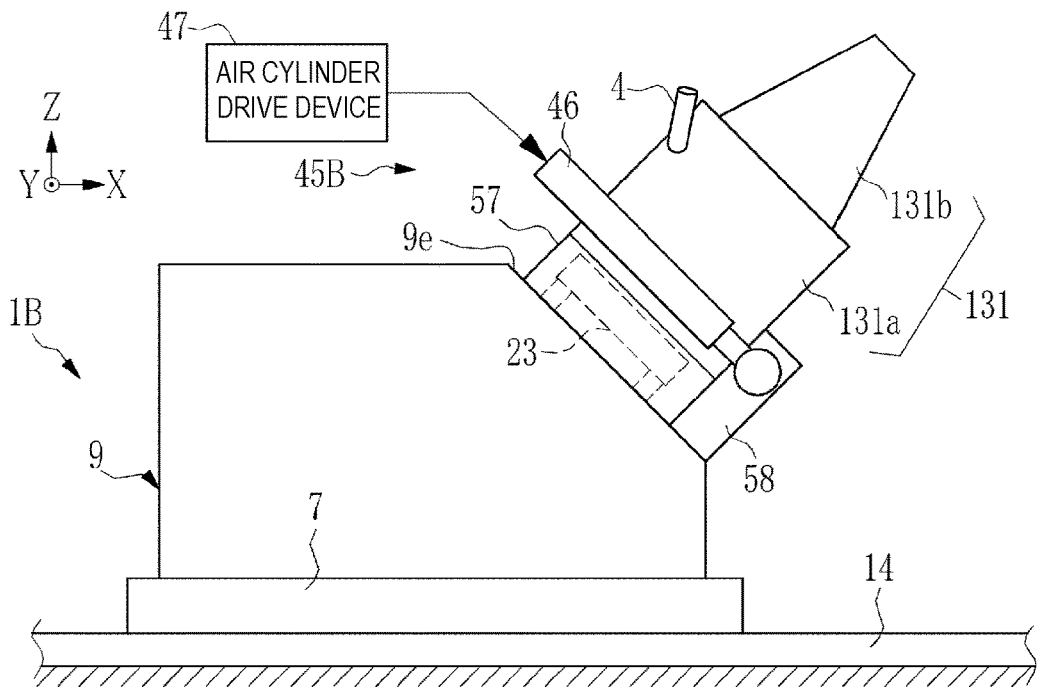
FIG. 23 is a side view of the state in which the vessel is located at the first position in an EUV light generation apparatus according to a second embodiment.
Figure 24:
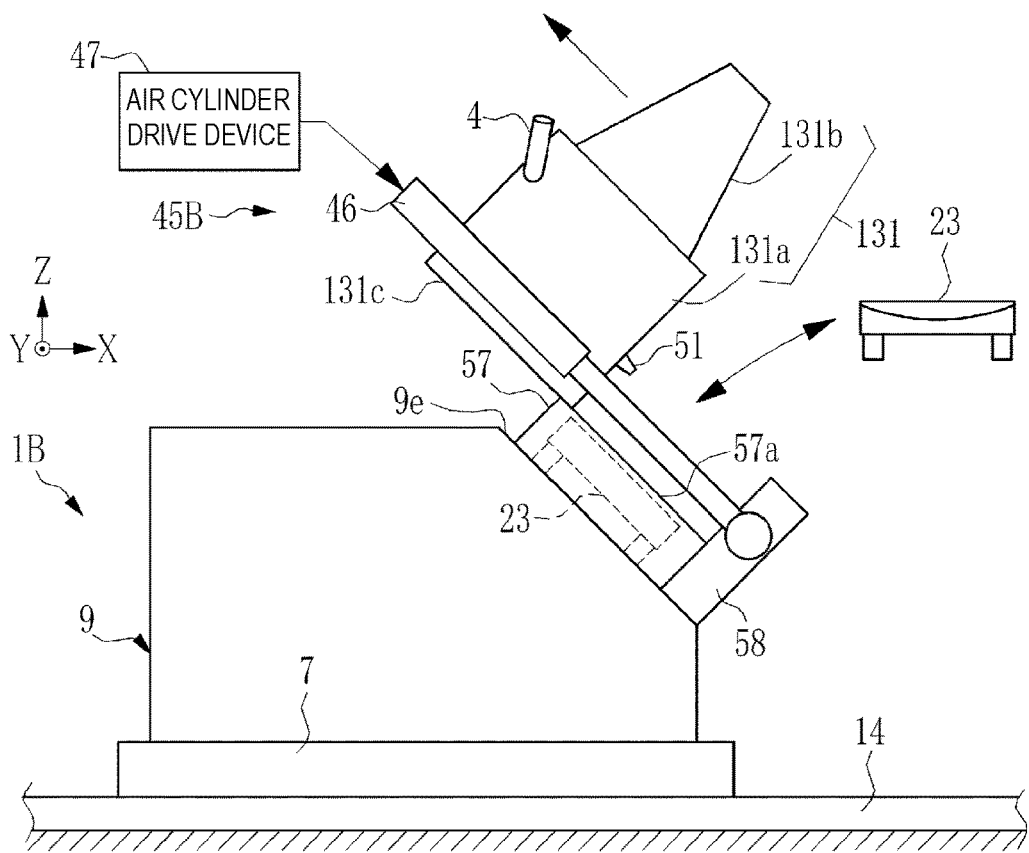
FIG. 24 is a side view of the state in which the vessel is located at the second position in the EUV light generation apparatus according to the second embodiment.

The following describes an EUV light generation apparatus 1B of a second embodiment illustrated in FIGS. 23 and 24. The second embodiment has a basic configuration same as that of the first embodiment, and the difference therebetween includes the form of a vessel 131 and the configuration of a vessel movement mechanism 45B in the second embodiment. The following description is mainly made on the difference, any component identical to that of the first embodiment is denoted by an identical reference sign, and description thereof will be omitted as appropriate.

3.1 Description of EUV Light Generation Apparatus of the Second Embodiment

The EUV light generation apparatus 1B of the second embodiment includes the vessel 131. Similarly to the vessel 13 of the first embodiment, the vessel 131 is a tubular member forming the chamber 2, and includes a body part 131a having a rectangular tubular shape, and a connection unit 131b having a substantially circular truncated cone shape.

A base unit 57 that functions as a base of the vessel 131 is provided to the attachment surface 9e of the chamber reference member 9. The base unit 57 is disposed around the EUV light condenser mirror 23 being attached to the attachment surface 9e, and forms the chamber 2 together with the vessel 131. The base unit 57 has a circular ring shape, and has an outer diameter equal to the diameter of the vessel 131 on the base end side and an inner diameter equal to the inner diameter of the vessel 131. The height of the base unit 57 from the attachment surface 9e in the axial direction of the vessel 13 is higher than the EUV light condenser mirror 23.

The vessel movement mechanism 45B slides the vessel 131 in a direction intersecting with the axial direction of the vessel 131, more specifically, in a direction orthogonal to the axial direction of the vessel 131. Accordingly, the vessel movement mechanism 45B moves the vessel 131 between the first position illustrated in FIG. 23 and the second position illustrated in FIG. 24. The direction of this slide movement is parallel to an upper end surface 57a of the base unit 57.

As illustrated in FIG. 23, at the first position, the center of the vessel 131 in the axial direction coincides with the center of the base unit 57 having a circular ring shape in the radial direction, and an end face 131c of the vessel 131 on the base end side contacts the upper end surface 57a of the base unit 57. In this state, the EUV light condenser mirror 23 is covered by the vessel 131.

The second position illustrated in FIG. 24 is a position to which the vessel 131 is moved through obliquely upward slide relative to the first position. At the second position, the vessel 131 is retracted from above the EUV light condenser mirror 23 to externally expose the EUV light condenser mirror 23.

Similarly to the vessel movement mechanism 45A of the first embodiment, the vessel movement mechanism 45B of the second embodiment includes each air cylinder 46 and the corresponding air cylinder drive device 47. However, the vessel movement mechanism 45B of the second embodiment is disposed so that the posture of attachment of the air cylinder 46 is different from that in the first embodiment in a manner that the axial direction of the air cylinder 46 intersects with the axial direction of the vessel 131.

In the EUV light generation apparatus 1B of the second embodiment, a supporting unit 58 to which one end of the air cylinder 46 is fixed is provided at one end part of the attachment surface 9e of the chamber reference member 9. The other end of the air cylinder 46 is fixed to the vessel 131. Accordingly, the vessel movement mechanism 45B slides the vessel 131 in a direction intersecting with the axial direction of the vessel 131 through expansion and contraction of the air cylinder 46.

In the second embodiment, the number of the air cylinders 46 is two, and the two air cylinders 46 are provided on the respective side surfaces of the EUV light generation apparatus 1B in the width direction. As described in the first embodiment, the number of the air cylinders 46 is changeable as appropriate.

The vessel 131 is provided with the taper pin 51 at part of a side surface of the body part 13a, facing the supporting unit 58. The supporting unit 58 is provided with an engagement hole to be engaged with the taper pin 51, which is same as the engagement hole 52 of the first embodiment. The taper pin 51 and the engagement hole are included in the positioning mechanism of the vessel 131 as described in the first embodiment.

3.2 Effect

In the second embodiment as well, since the vessel movement mechanism 45B is provided, the crane 41 does not need to be used for the replacement work of the EUV light condenser mirror 23. Thus, the replacement work of the EUV light condenser mirror 23 can be performed in a shorter time with less labor than in the comparative example using the crane 41, which is the same effect as that of the first embodiment. In addition, it is easy to perform positioning of the vessel 131 because of the effect of the positioning mechanism including the taper pins 51.

In the vessel movement mechanism 45B of the second embodiment, unlike the first embodiment, the slide direction of the vessel 131 intersects with the axial direction of the vessel 13. Thus, at the second position illustrated in FIG. 24, the vessel 131 is retracted from above the EUV light condenser mirror 23 and the attachment surface 9e, which facilitates access to the attachment surface 9e and the EUV light condenser mirror 23.

4. Third Embodiment

Figure 25:
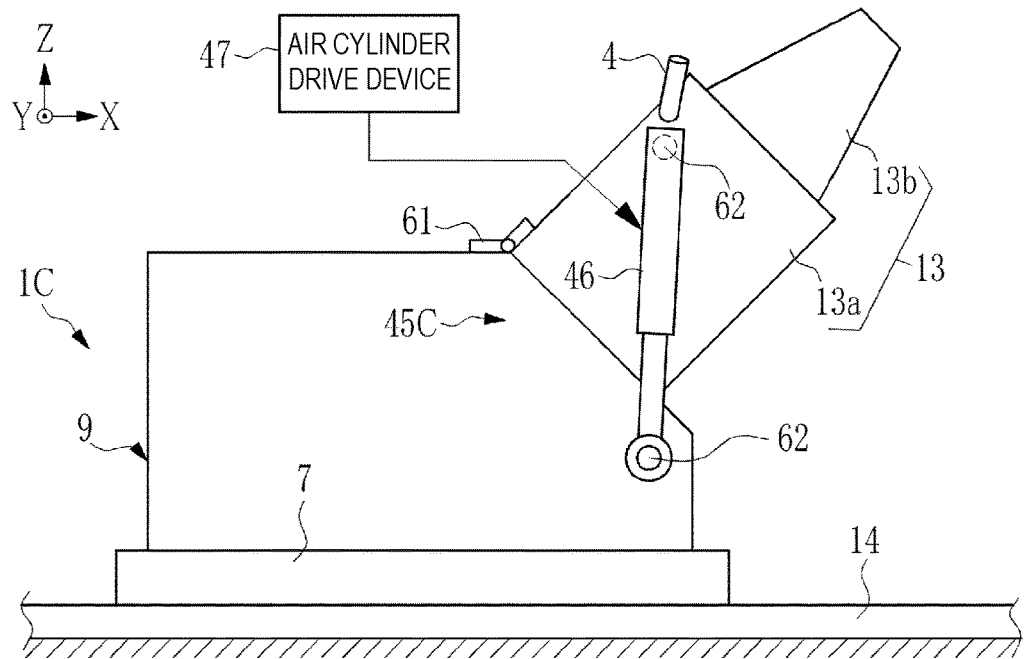
FIG. 25 is a side view of the state in which the vessel is located at the first position in an EUV light generation apparatus according to a third embodiment.
Figure 26:
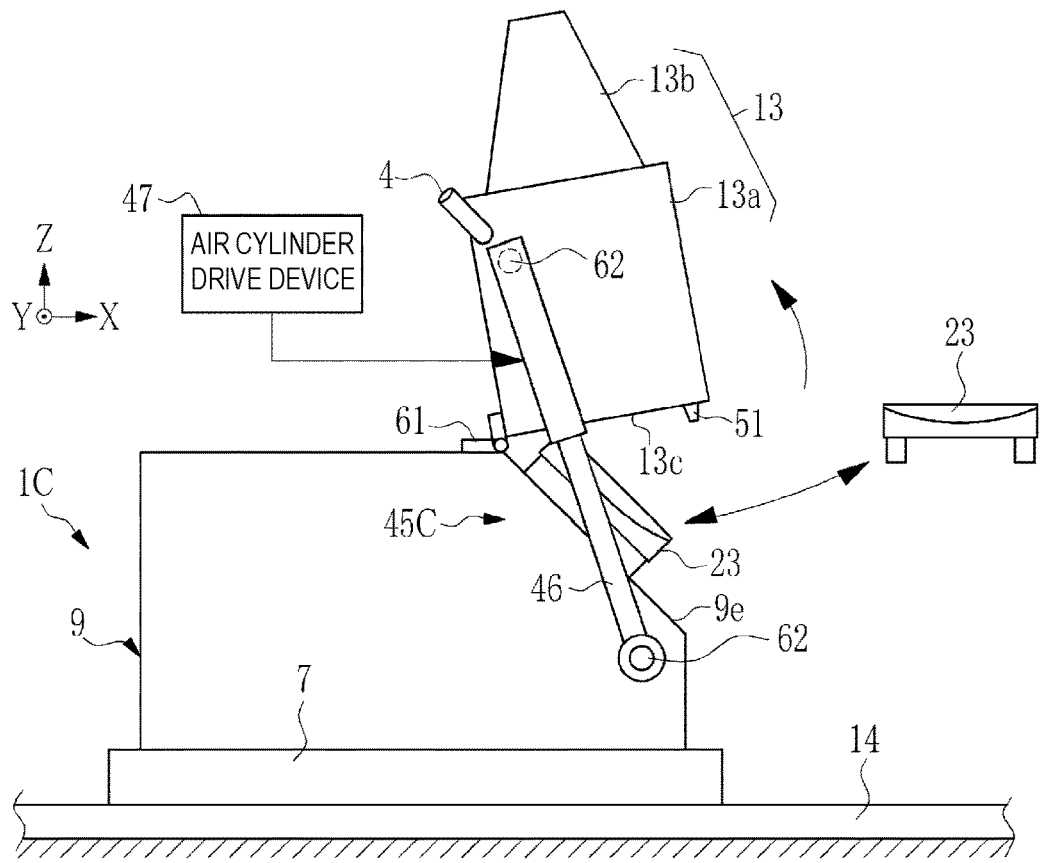
FIG. 26 is a side view of the state in which the vessel is located at the second position in the EUV light generation apparatus according to the third embodiment.

The following describes an EUV light generation apparatus 1C of a third embodiment illustrated in FIGS. 25 and 26. The third embodiment has a basic configuration same as that of the first embodiment, and the difference therebetween includes the movement aspect of the vessel 13 and the configuration of a vessel movement mechanism 45C. The following description is mainly made on the difference, any component identical to that of the first embodiment is denoted by an identical reference sign, and description thereof will be omitted as appropriate.

4.1 Description of EUV Light Generation Apparatus of the Third Embodiment

The EUV light generation apparatus 1C of the third embodiment includes the vessel 13, which is same as that in the first embodiment. The movement aspect of the vessel 13 of the third embodiment is rotational movement unlike the linear movement in the first embodiment.

Specifically, in the third embodiment, the vessel 13 is rotatably attached to the chamber reference member 9 through a hinge 61 at one end of the attachment surface 9e. The hinge 61 is attached to an upper end part of the chamber reference member 9 on the back side on the attachment surface 9e.

The vessel 13 rotationally moves between the first position at which the vessel 13 covers the EUV light condenser mirror 23 as illustrated in FIG. 25 and the second position at which the EUV light condenser mirror 23 is externally exposed as illustrated in FIG. 26. When moving from the first position toward the second position, the vessel 13 rotates in the anticlockwise direction with the hinge 61 as a pivot and flips up toward the back side of the chamber reference member 9, which is movement as if a lid opens. Accordingly, at the second position, the end face 13c of the vessel 13 is separated from the attachment surface 9e of the chamber reference member 9, and the EUV light condenser mirror 23 is externally exposed.

Similarly to the first embodiment, the vessel movement mechanism 45C includes each air cylinder 46 and the corresponding air cylinder drive device 47. The air cylinder 46 has one end attached to the vessel 13 through an attachment shaft 62 and the other end attached to the chamber reference member 9 through another attachment shaft 62. In the third embodiment, each end part of the air cylinder 46 is rotatable about the attachment shaft 62 relative to the vessel 13 and the chamber reference member 9.

When the air cylinder 46 expands, the vessel 13 rotationally moves from the first position illustrated in FIG. 25 to the second position illustrated in FIG. 26 with the hinge 61 as a pivot. In this process, the air cylinder 46 rotates about the attachment shafts 62 relative to the vessel 13 and the chamber reference member 9.

Similarly to the first embodiment, the vessel 13 is provided with the taper pins 51 included in the positioning mechanism. In the third embodiment as well, the O ring 53 and the ring groove 54 same as those in the first embodiment may be provided.

4.2 Effect

In the third embodiment as well, since the vessel movement mechanism 45C is provided, the crane 41 does not need to be used for the replacement work of the EUV light condenser mirror 23. Thus, the replacement work of the EUV light condenser mirror 23 can be performed in a shorter time with less labor than in the comparative example using the crane 41, which is the same effect as that of the first embodiment. In addition, it is easy to perform positioning of the vessel 13 because of the effect of the positioning mechanism including the taper pins 51.

Unlike the first embodiment, the vessel movement mechanism 45C of the third embodiment rotationally moves the vessel 13 with the hinge 61 as a pivot. Thus, at the second position illustrated in FIG. 26, the vessel 13 is retracted from above the EUV light condenser mirror 23 and the attachment surface 9e, which facilitates access to the attachment surface 9e and the EUV light condenser mirror 23.

In the third embodiment, at the second position at which the end face 13c is separated from the attachment surface 9e, one side of the vessel 13 is supported to the chamber reference member 9 through the hinge 61. Thus, the air cylinder 46 does not need to support the entire weight of the vessel 13, which leads to a reduced load on the air cylinder 46. The reduced load on the air cylinder 46 is expected to provide effects of reducing the number of the air cylinders 46 and downsizing.

5. Fourth Embodiment

Figure 27:
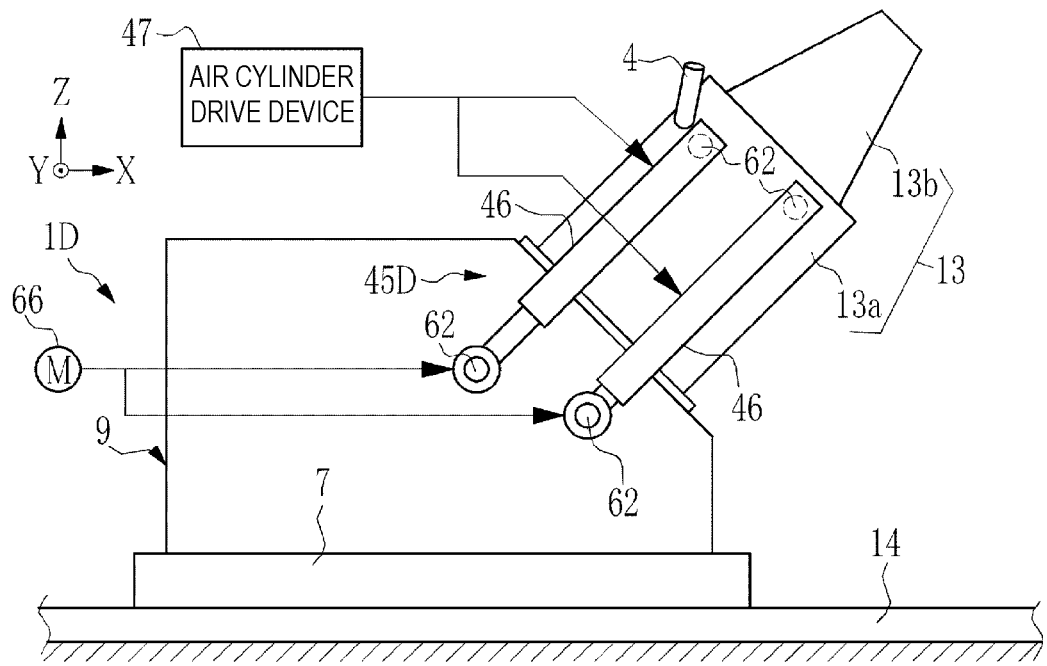
FIG. 27 is a side view of the state in which the vessel is located at the first position in an EUV light generation apparatus according to a fourth embodiment.
Figure 28:
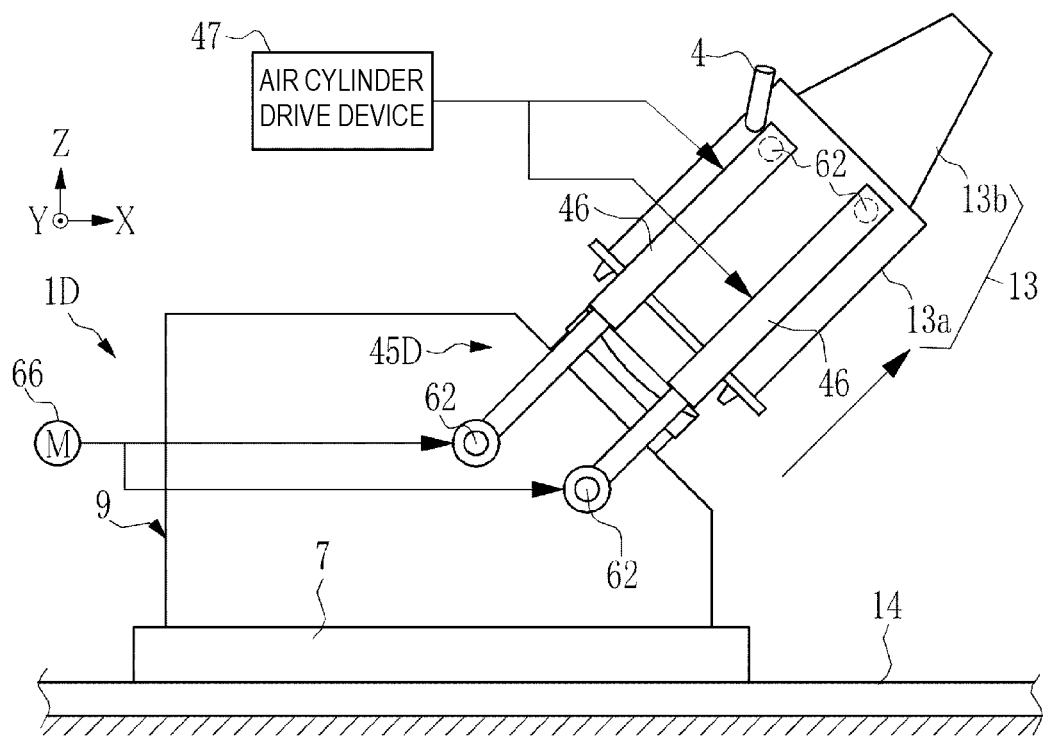
FIG. 28 is a side view of a state in which the vessel is located at a middle position in the EUV light generation apparatus according to the fourth embodiment.
Figure 29:
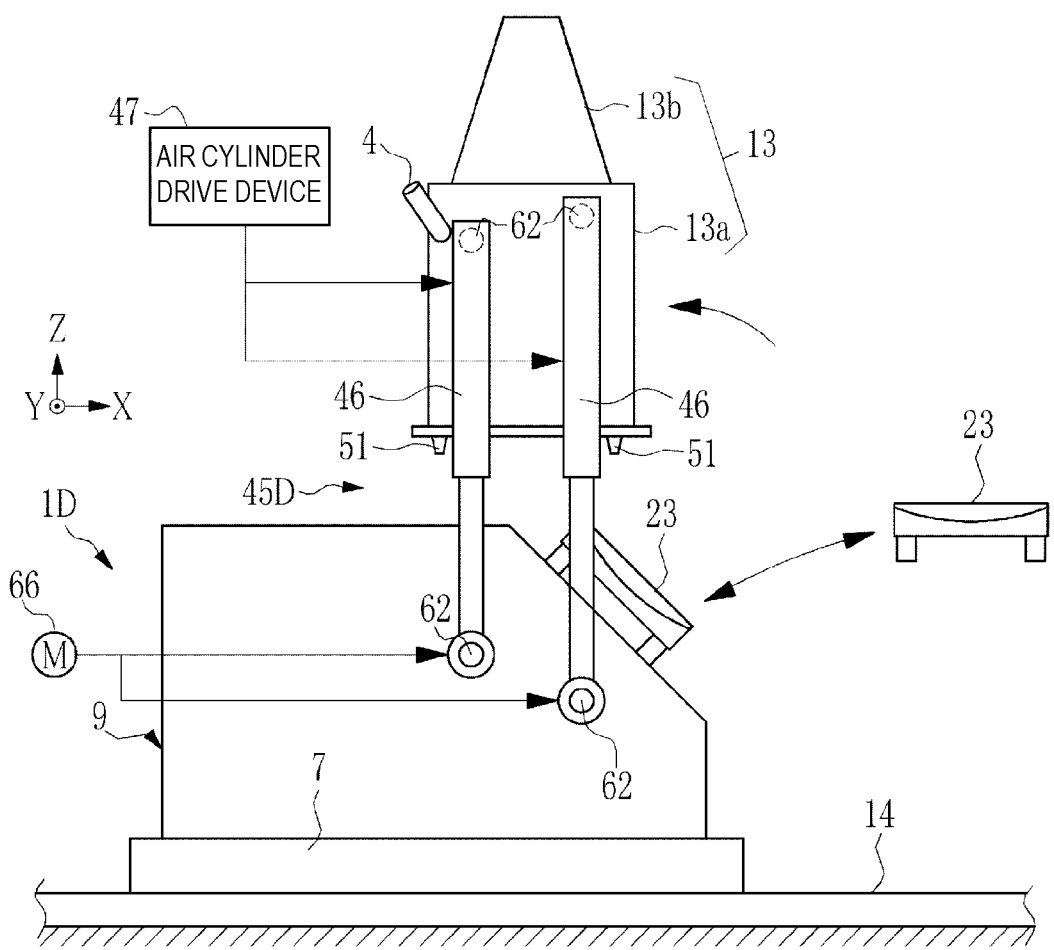
FIG. 29 is a side view of the state in which the vessel is located at the second position in the EUV light generation apparatus according to the fourth embodiment.

The following describes an EUV light generation apparatus 1D of a fourth embodiment illustrated in FIGS. 27 to 29. The fourth embodiment has a basic configuration same as that of each of the first to third embodiments, and the difference therebetween includes the movement aspect of the vessel 13 and the configuration of a vessel movement mechanism 45D. The following description is mainly made on the difference, any component identical to that of the first to third embodiments is denoted by an identical reference sign, and description thereof will be omitted as appropriate.

5.1 Description of EUV Light Generation Apparatus of the Fourth Embodiment

The EUV light generation apparatus 1D of the fourth embodiment includes the vessel 13, which is same as that in the first embodiment. The movement aspect of the vessel 13 of the fourth embodiment is combination of linear movement and rotational movement.

Similarly to the first embodiment, the vessel 13 is provided to the chamber reference member 9 in a separable manner. The vessel movement mechanism 45D includes a motor 66 in addition to each air cylinder 46 and the corresponding air cylinder drive device 47. The air cylinder drive device 47 is a drive device for expanding and contracting the air cylinder 46, and the motor 66 is a drive device for rotating the air cylinder 46.

Similarly to the third embodiment, each air cylinder 46 has one end attached to the vessel 13 through the one attachment shaft 62 and the other end attached to the chamber reference member 9 through the other attachment shaft 62. End parts of the air cylinder 46 are rotatable about the respective attachment shafts 62 relative to the vessel 13 and the chamber reference member 9. The four air cylinders 46 are provided in total with two of them being disposed on each side surface of the EUV light generation apparatus 1D.

The vessel 13 of the fourth embodiment is movable between the first position at which the vessel 13 covers the EUV light condenser mirror 23 as illustrated in FIG. 27 and the second position at which the EUV light condenser mirror 23 is externally exposed as illustrated in FIG. 29. When moving between the first position illustrated in FIG. 27 and the second position illustrated in FIG. 29, the vessel 13 of the fourth embodiment passes through a middle position illustrated in FIG. 28.

While the vessel 13 is located at the first position, each air cylinder 46 is disposed in a posture in which the axial direction thereof is aligned with the axial direction of the vessel 13. The vessel movement mechanism 45D first expands the air cylinder 46 to linearly move the vessel 13 in the axial direction of the vessel 13 from the first position illustrated in FIG. 27 toward the middle position illustrated in FIG. 28. Thereafter, in the state illustrated in FIG. 28, the motor 66 is driven to rotate the air cylinder 46 about the attachment shafts 62 provided to the chamber reference member 9. Accordingly, the vessel 13 rotationally moves toward the back side of the chamber reference member 9.

When each air cylinder 46 is rotated, the corresponding air cylinder drive device 47 is driven in addition to the motor 66 to adjust the length of the air cylinder 46 while expanding and contracting the air cylinder 46. In the present example, the two air cylinders 46 are disposed on each side of the EUV light generation apparatus 1D, and the rotation center of the vessel 13 is set to one end of each air cylinder 46 on the back side. Thus, the length of the air cylinder 46 on the front side is adjusted along with the rotational movement of the vessel 13. Each air cylinder 46 is driven in this manner to move the vessel 13 to the second position illustrated in FIG. 29 at which the axial direction thereof is substantially vertical.

Similarly to the first to third embodiments, the vessel 13 is provided with the taper pins 51 included in the positioning mechanism. In the fourth embodiment, the O ring 53 and the ring groove 54 same as those in the first embodiment may be provided.

5.2 Effect

In the fourth embodiment as well, since the vessel movement mechanism 45D is provided, the crane 41 does not need to be used for the replacement work of the EUV light condenser mirror 23. Thus, the replacement work of the EUV light condenser mirror 23 can be performed in a shorter time with less labor than in the comparative example using the crane 41, which is the same effect as that of the first embodiment. In addition, it is easy to perform positioning of the vessel 13 because of the effect of the positioning mechanism including the taper pins 51.

Similarly to the second and third embodiments, at the second position illustrated in FIG. 29, the vessel 13 is retracted from above the EUV light condenser mirror 23 and the attachment surface 9e by the vessel movement mechanism 45D of the fourth embodiment, which facilitates access to the attachment surface 9e and the EUV light condenser mirror 23. In addition, the vessel movement mechanism 45D of the fourth embodiment moves the vessel 13 between the first position and the second position in combination of linear movement and rotational movement. Thus, the vessel 13 can be moved through a relatively free trajectory and can be easily moved to a position suitable for the replacement work of the EUV light condenser mirror 23 such as a position at which a sufficient space is obtained for access to the EUV light condenser mirror 23. As a result, the time taken for the replacement work is expected to reduce.

6. Fifth Embodiment

Figure 30:
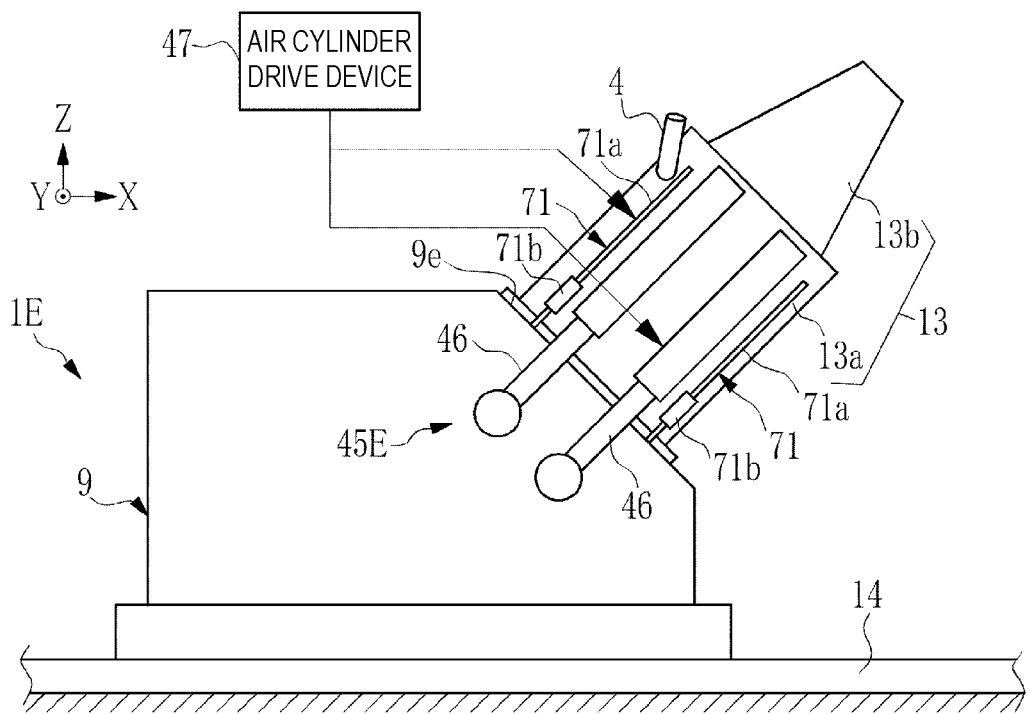
FIG. 30 is a side view of the state in which the vessel is located at the first position in an EUV light generation apparatus according to a fifth embodiment.
Figure 31:
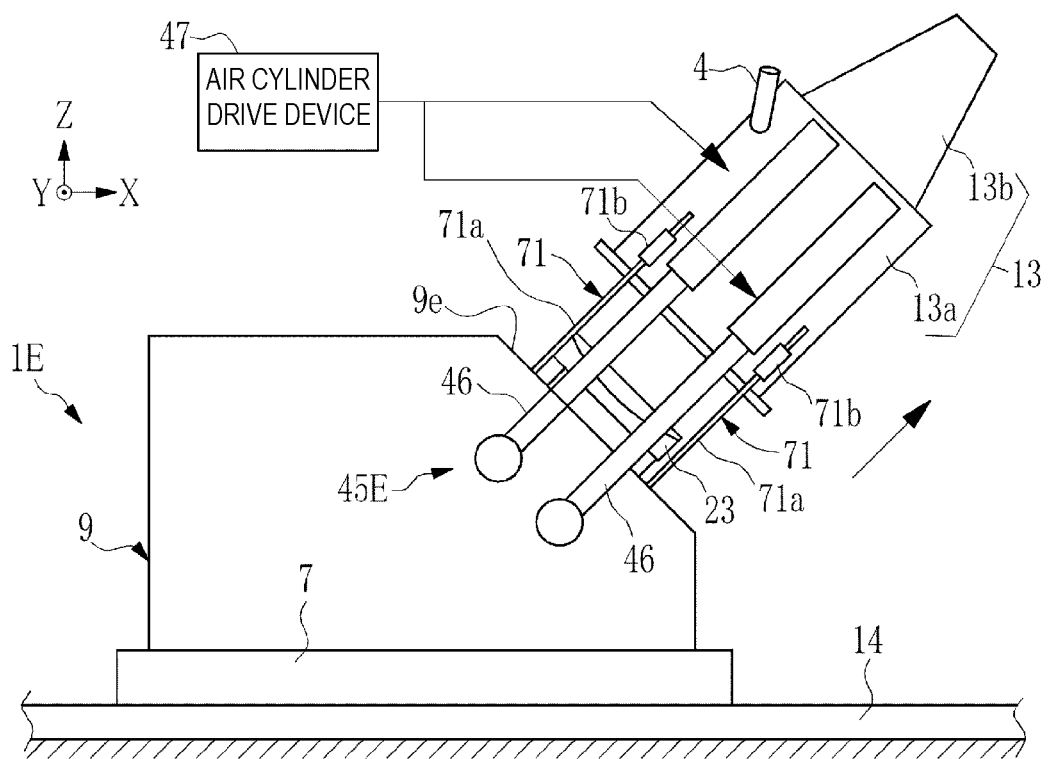
FIG. 31 is a side view of the state in which the vessel is located at the second position in the EUV light generation apparatus according to the fifth embodiment.

The following describes an EUV light generation apparatus 1E of a fifth embodiment illustrated in FIGS. 30 to 31. The fifth embodiment has a basic configuration same as that of the first embodiment. The fifth embodiment is same as the first embodiment in the movement aspect in which the vessel 13 linearly moves in the axial direction of the vessel 13 and the configuration of each air cylinder 46. The difference therebetween includes the configuration of the positioning mechanism of a vessel movement mechanism 45E. The following description is mainly made on the difference, any component identical to that of the first embodiment is denoted by an identical reference sign, and description thereof will be omitted as appropriate.

The vessel movement mechanism 45E includes, as the positioning mechanism, ball splines 71 in place of the taper pins 51. As publicly known, each ball spline 71 includes a spline shaft 71a in which a key groove is formed in the axial direction, and a slider 71b configured to slide relative to the spline shaft 71a along the key groove. The slider 71b and the key groove are engaged with each other through a ball that rolls in the key groove. In each ball spline 71, one end of the spline shaft 71a is attached to the chamber reference member 9, and the slider 71b is attached to the vessel 13. The ball splines 71 thus configured allow accurate positioning of the vessel 13 and the chamber reference member 9.

7. Sixth Embodiment

Figure 32:
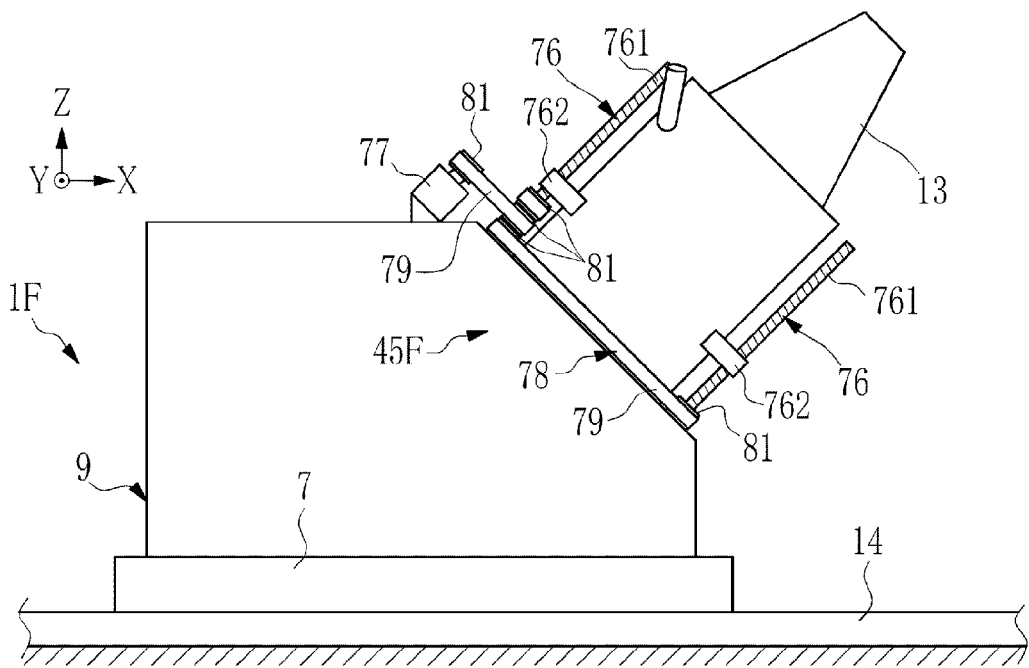
FIG. 32 is a side view of the state in which the vessel is located at the first position in an EUV light generation apparatus according to a sixth embodiment.
Figure 33:
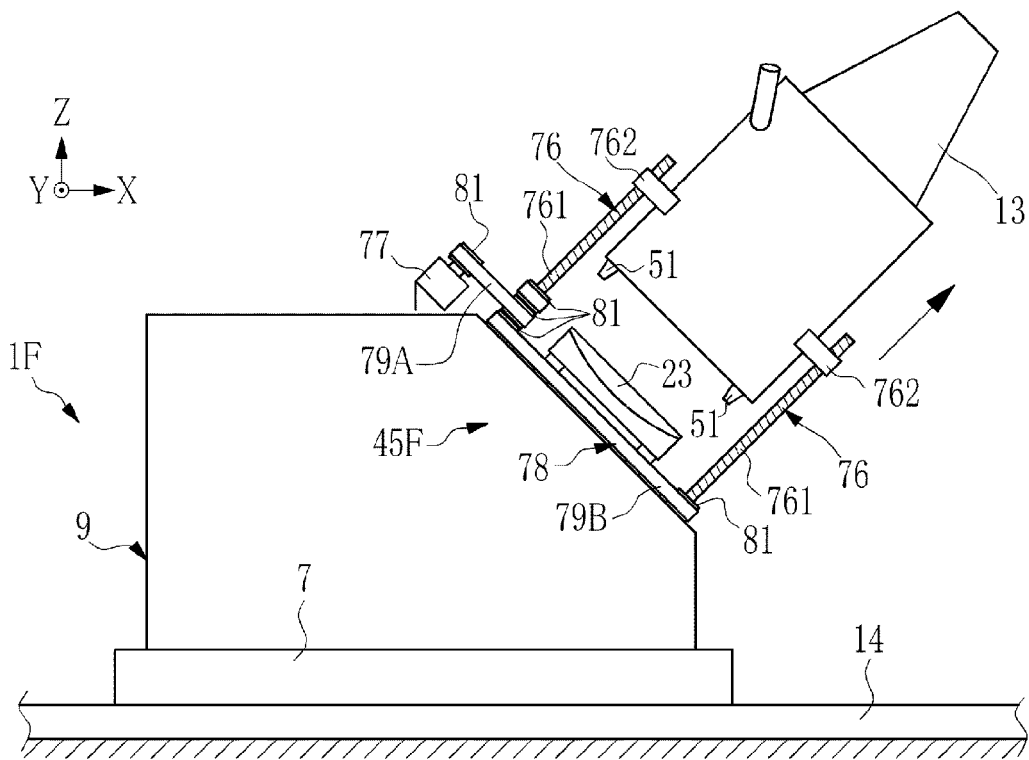
FIG. 33 is a side view of the state in which the vessel is located at the second position in the EUV light generation apparatus according to the sixth embodiment.
Figure 34:
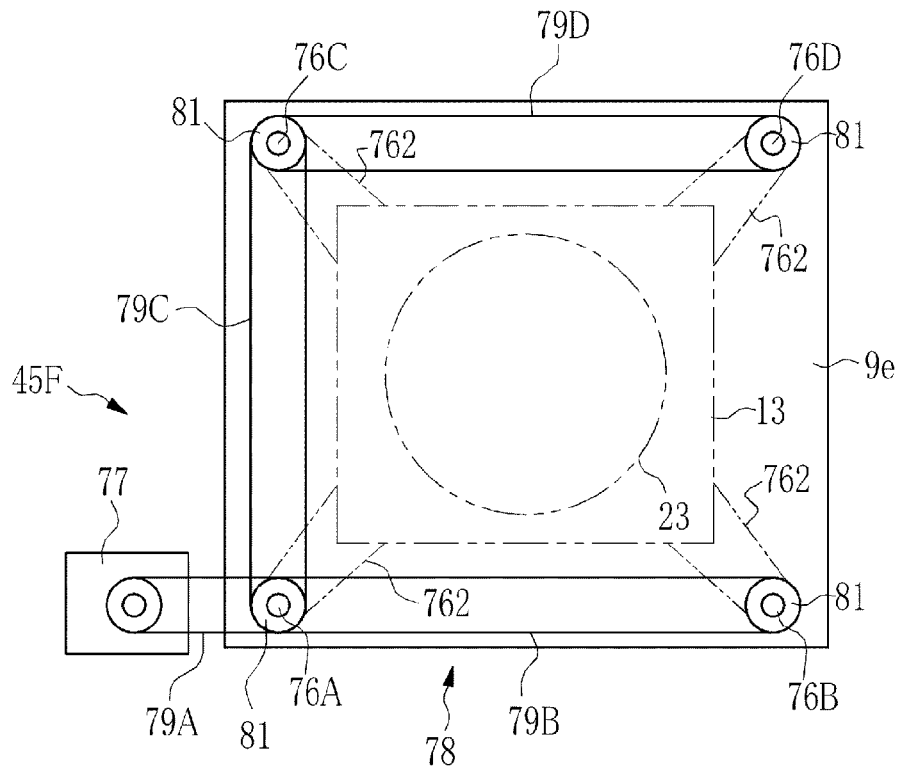
FIG. 34 is a plan view illustrating a vessel movement mechanism including a belt mechanism in the EUV light generation apparatus according to the sixth embodiment.

The following describes an EUV light generation apparatus 1F of a sixth embodiment illustrated in FIGS. 32 to 34. The sixth embodiment has a basic configuration same as that of the first embodiment. The sixth embodiment is same as the first embodiment in the movement aspect in which the vessel 13 linearly moves in the axial direction of the vessel 13. The difference therebetween includes the configuration of a vessel movement mechanism 45F. The following description is mainly made on the difference, any component identical to that of the first embodiment is denoted by an identical reference sign, and description thereof will be omitted as appropriate.

The vessel movement mechanism 45F of the sixth embodiment includes, as the link member, ball screws 76 in place of the air cylinders 46. As publicly known, each ball screw 76 includes a screw shaft 761 and a nut 762. The screw shaft 761 is provided with a screw groove to be engaged with the nut 762 on the outer periphery of the shaft, and corresponds to a main shaft. The nut 762 corresponds to a slide member engaged with the screw shaft 761 and is configured to relatively slide in the axial direction of the screw shaft 761 while relatively rotating about the axis of the screw shaft 761. Accordingly, in the ball screw 76, as one of the screw shaft 761 and the nut 762 rotates about the axis, the other slides in the axial direction. In the ball screw 76, the screw shaft 761 and the nut 762 are engaged with each other through a ball that rolls in the screw groove.

As illustrated in FIGS. 32 and 33, in each ball screw 76, one end of the screw shaft 761 is attached to the chamber reference member 9, and the nut 762 is attached to the vessel 13. The screw shaft 761 is attached to the chamber reference member 9 rotatably about the axis. The ball screw 76 is disposed so that the axial direction thereof is aligned with the direction in which the vessel 13 moves. In the present example, the ball screw 76 is disposed in the axial direction of the vessel 13, similarly to each air cylinder 46 of the first embodiment. Since the nut 762 is fixed to the vessel 13, the vessel 13 linearly moves in the axial direction of the screw shaft 761 together with the nut 762 as the screw shaft 761 rotates.

FIG. 34 illustrates a plan view of the attachment surface 9e and the vessel movement mechanism 45F when viewed from above in a direction orthogonal to the attachment surface 9e. As illustrated in FIG. 34, the four ball screws 76 are disposed at four respective corners of the vessel 13 having a rectangular tubular shape. The vessel movement mechanism 45F includes a motor 77 and a belt mechanism 78 as drive devices configured to drive the ball screws 76. The belt mechanism 78 includes a drive belt 79 and a gear 81. The gear 81 is attached to each ball screw 76. In FIG. 34, the four ball screws 76 are distinguished from each other as ball screws 76A to 76D, the reference signs being obtained by adding sub reference signs A to D to reference sign 76. Similarly, in FIG. 34, the drive belts 79 are distinguished from each other as drive belts 79A to 79D.

As illustrated in FIGS. 32 to 34, the ball screw 76A directly coupled with the motor 77 by the drive belt 79A is provided with the three gears 81. In the ball screw 76A, the drive belt 79A is placed around one of the gears 81. The drive belt 79B is placed around another one of the gear 81. The drive belt 79B is coupled with the gear 81 of the ball screw 76B. The drive belt 79C is placed around the third gear 81 of the ball screw 76A and coupled with the gear 81 of the ball screw 76C. The ball screw 76C is provided with another gear 81 and coupled with the ball screw 76D by the drive belt 79D through each gear 81.

With the belt mechanism 78 thus configured, the four ball screws 76B can be simultaneously rotated in the same direction by using the single motor 77. Thus, the vessel 13 can be moved by driving the four ball screws 76B through the single motor 77. In the sixth embodiment, the taper pins 51 are provided as the positioning mechanism.

In the sixth embodiment as well, the basic effect of providing the vessel movement mechanism 45F is same as that in the first embodiment. Since the vessel movement mechanism 45F includes the ball screws 76 in place of the air cylinders 46, this configuration is effective when the air cylinders 46 cannot be used due to, for example, the shapes of the vessel 13 and the chamber reference member 9. In addition, since the vessel movement mechanism 45F uses the motor 77 as a drive device, the vessel 13 can be moved, for example, when a compression air supply and discharge device that functions as an air cylinder drive device cannot be used.

8. Seventh Embodiment

Figure 35:
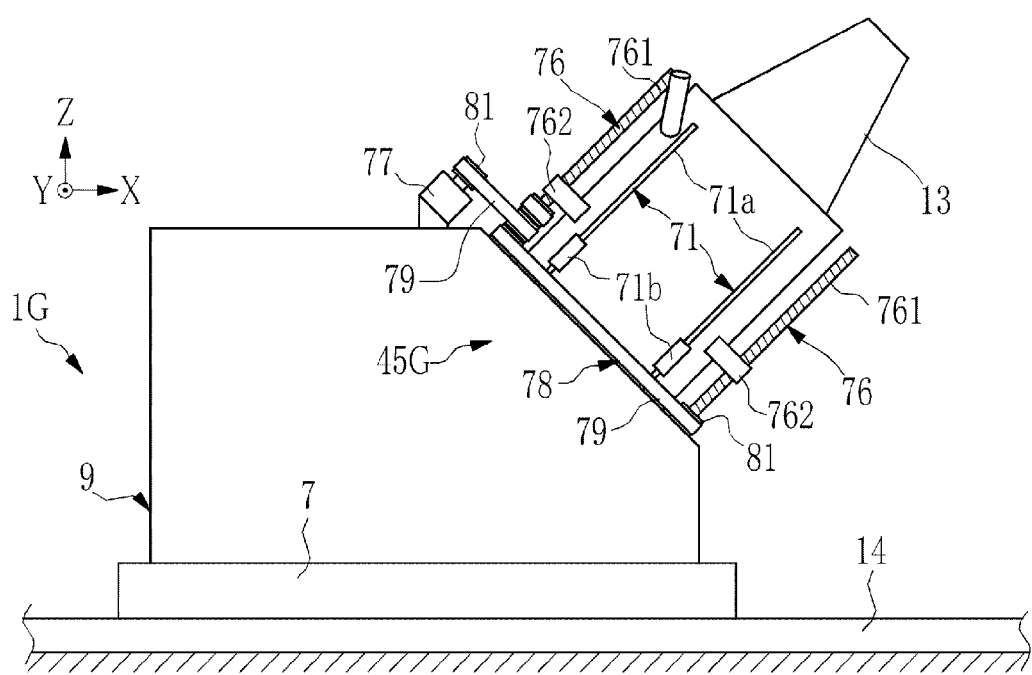
FIG. 35 is a side view of the state in which the vessel is located at the first position in an EUV light generation apparatus according to a seventh embodiment.
Figure 36:
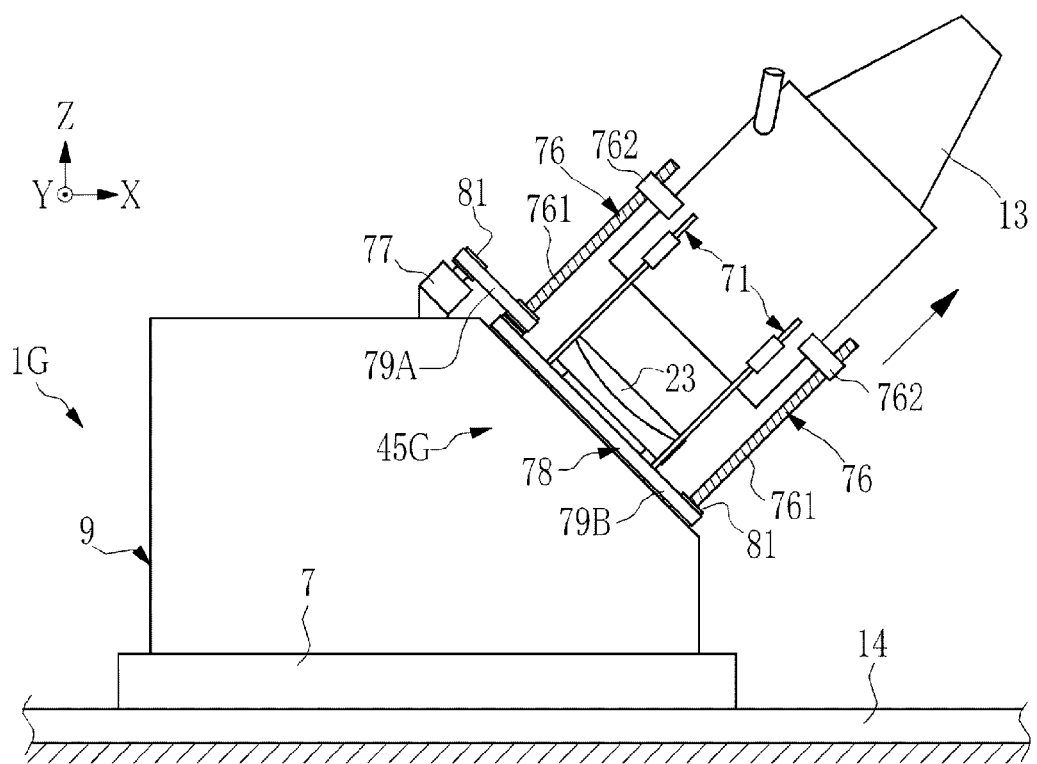
FIG. 36 is a side view of the state in which the vessel is located at the second position in the EUV light generation apparatus according to the seventh embodiment.
Figure 37:
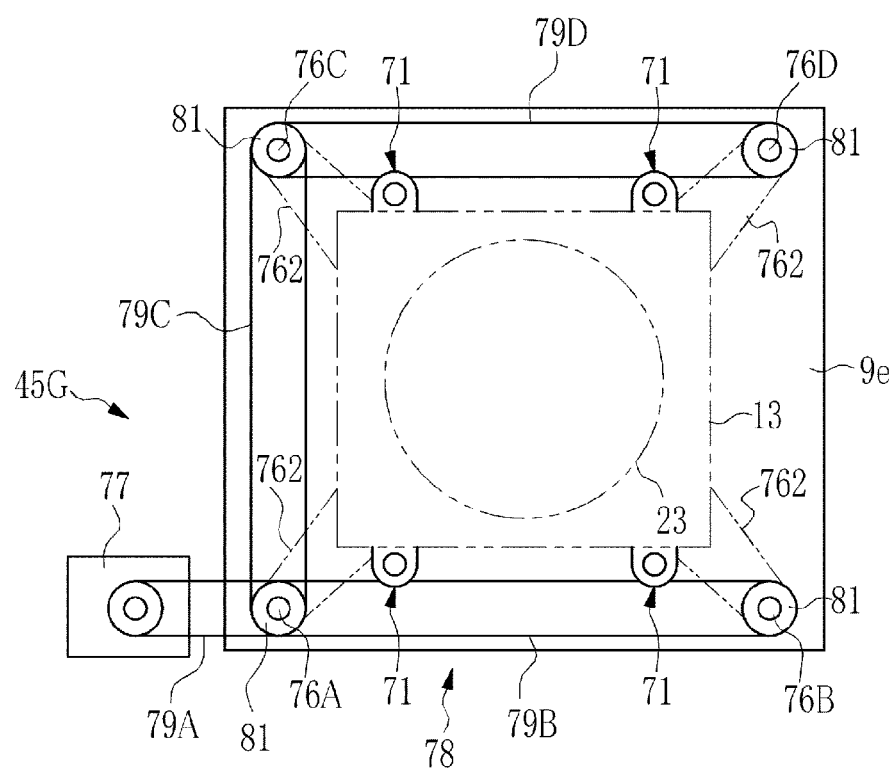
FIG. 37 is a plan view illustrating the vessel movement mechanism including the belt mechanism in the EUV light generation apparatus according to the seventh embodiment.

The following describes an EUV light generation apparatus 1G of a seventh embodiment illustrated in FIGS. 35 to 37. The seventh embodiment has a basic configuration same as that of the sixth embodiment, and the difference therebetween is that the ball splines 71 are used in place of the taper pins 51 as the positioning mechanism of a vessel movement mechanism 45G. The other configuration is same as that of the sixth embodiment.

As illustrated in FIGS. 35 to 37, the four ball splines 71 are provided in total with two of them being disposed on each side surface of the EUV light generation apparatus 1G. In each ball spline 71, the spline shaft 71a is attached to the chamber reference member 9, and the slider 71b is attached to the vessel 13. The basic effect is same as that of the sixth embodiment.

The above description is intended to provide not restriction but examples. Thus, the skilled person in the art would clearly understand that the embodiments of the present disclosure may be modified without departing from the scope of the claims.

The terms used throughout the specification and the appended claims should be interpreted as "non-limiting". For example, the term "comprising" or "comprised" should be interpreted as "not limited to what has been described as being comprised". The term "having" should be interpreted as "not limited to what has been described as having". Further, the modifier "a/an" described in the specification and the appended claims should be interpreted to mean "at least one" or "one or more".

What is claimed is:

1. An extreme ultraviolet light generation apparatus comprising:
   A. a chamber in which extreme ultraviolet light is generated by a target substance being irradiated with a laser beam to generate plasma from the target substance;
   B. a vessel as a tubular member forming the chamber;
   C. a reference member supporting the vessel;
   D. a collector mirror configured to condense the extreme ultraviolet light in the chamber, the collector mirror being attached to the reference member in a replaceable manner and covered by the vessel to be housed in the chamber; and
   E. a vessel movement mechanism provided to the reference member and configured to move the vessel between a first position at which the vessel covers the collector mirror and a second position at which the vessel is retracted from the first position to expose the collector mirror.

2. The extreme ultraviolet light generation apparatus according to claim 1, wherein, in the reference member, an attachment surface to which the collector mirror is attached is tilted relative to the horizontal direction.

3. The extreme ultraviolet light generation apparatus according to claim 1, further comprising:
   F. a target sensor provided to the vessel and configured to measure the target substance in the chamber.

4. The extreme ultraviolet light generation apparatus according to claim 1, wherein the vessel movement mechanism includes a link member including a main shaft and a slide member configured to slide relative to the main shaft in the axial direction of the main shaft, one of the main shaft and the slide member being attached to the reference member, the other of the main shaft and the slide member being attached to the vessel, and moves the vessel relative to the reference member through the relative slide of the main shaft and the slide member.

5. The extreme ultraviolet light generation apparatus according to claim 4, wherein the link member is an air cylinder including a piston rod functioning as the main shaft, and a cylinder functioning as the slide member.

6. The extreme ultraviolet light generation apparatus according to claim 4, wherein the link member is a ball screw including a screw shaft functioning as the main shaft, and a nut functioning as the slide member configured to relatively slide in the axial direction of the screw shaft while being engaged with the screw shaft and relatively rotating about the axis of the screw shaft.

7. The extreme ultraviolet light generation apparatus according to claim 4, wherein the vessel movement mechanism includes a drive device configured to drive the link member.

8. The extreme ultraviolet light generation apparatus according to claim 1, wherein the vessel movement mechanism linearly moves the vessel between the first position and the second position.

9. The extreme ultraviolet light generation apparatus according to claim 8, wherein the vessel movement mechanism moves the vessel in the axial direction of the vessel.

10. The extreme ultraviolet light generation apparatus according to claim 8, wherein the vessel movement mechanism slides the vessel in a direction intersecting with the axial direction of the vessel.

11. The extreme ultraviolet light generation apparatus according to claim 1, wherein the vessel movement mechanism rotationally moves the vessel at movement between the first position and the second position.

12. The extreme ultraviolet light generation apparatus according to claim 11, wherein
the vessel is rotatably attached to the reference member through a hinge at one end of the attachment surface, and
the vessel movement mechanism rotationally moves the vessel with the hinge as a pivot.

13. The extreme ultraviolet light generation apparatus according to claim 11, wherein the vessel movement mechanism moves the vessel between the first position and the second position in combination of linear movement and rotational movement.

14. The extreme ultraviolet light generation apparatus according to claim 1, further comprising:
G. a positioning mechanism configured to determine a position at which the vessel is attached to the reference member at the second position.

15. The extreme ultraviolet light generation apparatus according to claim 14, wherein the positioning mechanism includes a taper pin having an outer diameter that decreases from a base end side toward a leading end side, and an engagement hole to be engaged with the taper pin, one of the taper pin and the engagement hole being provided to the vessel, the other being provided to the reference member.

16. The extreme ultraviolet light generation apparatus according to claim 14, wherein the positioning mechanism is a ball spline including a spline shaft in which a key groove is formed in the axial direction, and a slider configured to slide relative to the spline shaft along the key groove, one of the spline shaft and the slider being attached to the vessel, the other being attached to the reference member.

17. The extreme ultraviolet light generation apparatus according to claim 1, further comprising:
H. an O ring disposed between the attachment surface and an end face of the vessel, which faces the attachment surface at the first position, to seal a gap between the attachment surface and the end face.

18. The extreme ultraviolet light generation apparatus according to claim 17, wherein a ring groove to which the O ring is attached is formed on the attachment surface or the end face.

19. The extreme ultraviolet light generation apparatus according to claim 18, wherein a sectional shape of the attachment groove is a substantially trapezoid shape having a smaller width at an opening than inside the ring groove.

* * * * *